US007923182B2

(12) United States Patent
Sandström et al.

(10) Patent No.: US 7,923,182 B2
(45) Date of Patent: Apr. 12, 2011

(54) MULTI-FOCUS METHOD OF ENHANCED THREE-DIMENSIONAL EXPOSURE OF RESIST

(75) Inventors: Torbjörn Sandström, Pixbo (SE); Mikael Wahlsten, Stockholm (SE); Mats Ekberg, Täby (SE); Anders Svensson, Stockholm (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 12/604,312

(22) Filed: Oct. 22, 2009

(65) Prior Publication Data
US 2010/0099051 A1     Apr. 22, 2010

Related U.S. Application Data

(60) Provisional application No. 61/107,581, filed on Oct. 22, 2008, provisional application No. 61/107,588, filed on Oct. 22, 2008, provisional application No. 61/107,591, filed on Oct. 22, 2008.

(51) Int. Cl.
*G03F 9/00* (2006.01)
*G03C 5/00* (2006.01)

(52) U.S. Cl. ............ 430/30; 430/292; 430/311; 430/945

(58) Field of Classification Search .................... 430/30, 430/292, 311, 945
See application file for complete search history.

(56) References Cited

U.S. PATENT DOCUMENTS

| | | | |
|---|---|---|---|
| 4,895,790 | A | 1/1990 | Swanson et al. |
| 5,545,308 | A | 8/1996 | Murphy et al. |
| 6,114,097 | A | 9/2000 | Malba et al. |
| 6,335,151 | B1 | 1/2002 | Ausschnitt et al. |
| 6,410,213 | B1 | 6/2002 | Raguin et al. |
| 6,730,256 | B1 | 5/2004 | Bloomstein et al. |
| 7,265,057 | B2 | 9/2007 | Liu |
| 7,303,853 | B2 | 12/2007 | Afromowitz |
| 7,473,500 | B2 | 1/2009 | Progler et al. |
| 7,531,104 | B1 | 5/2009 | Hwu |
| 2002/0019305 | A1 | 2/2002 | Wu |
| 2004/0137372 | A1 | 7/2004 | Livingston et al. |
| 2006/0263698 | A1 | 11/2006 | Mizuyama et al. |
| 2007/0175860 | A1 | 8/2007 | Liu |
| 2007/0269936 | A1 | 11/2007 | Tanaka et al. |
| 2008/0254372 | A1 | 10/2008 | Wu |
| 2008/0254373 | A1 | 10/2008 | Wu |

FOREIGN PATENT DOCUMENTS

| | | |
|---|---|---|
| EP | 1449636 A1 | 8/2004 |
| EP | 2083329 A2 | 7/2009 |
| WO | 2009/018846 A1 | 2/2009 |
| WO | PCT/US2008/009973 | 2/2009 |

OTHER PUBLICATIONS

Carsten Glasenapp and Hans Zappe, "Frequency analysis of maskless lithography system for generation of continuous phase patterns with homogeneous structure depth", Optical Engineering 47(2), 023002, Feb. 2008, pp. 1-7.

Gale, Michael T. Gale et al., "Fabrication of continuous-relief microopticalelements by direct laser writing in photoresists", Optical Engineering, Nov. 1994. vol. 33 No. 11, pp. 3556-3566.

Gale, Michael T. Gale et al., "Fabrication of continuous-relief microopticalelements by direct laser writing in photoresists", SPIE vol. 2045, Jun. 1994, pp. 54-62. (Downloaded from SPIE Digital Library on Oct. 9, 2009).

Wang, Chao et al., "Fabrication of diffractive optical elements with arbitrary surface-relief profil by direct laser writing", Optical Engineering,.41(6) 1240-1245, Jun. 2002, pp. 1240-1245.

Chi, Liu et al., "Imaging Simulation of Maskless Lithography Using a DMDTM" Advanced Microlithography Technologies, edited by Yangyuan Wang,Jun-en Yao, Christopher J. Progler, Proceedings of SPIE vol. 5645(SPIE, Bellingham, WA, 2005) pp. 307-314.

Gao, Yiqing et al., "Research on high-quality projecting reduction lithography system based on digital mask technique", Optik vol. 116 (2005) pp. 303-310.

Yu, et al., "Flexible fabrication of three-dimensional multi-layered microstructures using a scanning laser system", Sensors and Actuators, A125, (2006), pp. 553-564.

Kessels, Melanie et al., "Versatile stepper based maskless microlithography using a liquid crystal display for direct write of binary and multilevel microstructures", Micro/Nanolith. MEMS MOEMS 6(3),033002, Jul.-Sep. 2007, pp. 1-12.

Rossi, Markus et al., "Wafer-scale micro- and nano-optics fabrication technologies", Proceedings of the 10th Microoptics Conference, Sep. 1-3, 2004, (Accessible at http://wwwlan.fzk.de/moc2004/#).

Gale, Mike. T., "Direct Writing of Continuous-relief Micro-optics", Micro-Optics, Elements, systems and applications, Hans Peter Herzig, ed., Apr. 1997, pp. 87-126.

Cheng, Yao, "-Thich-film Lithography Using Laser Write", Microsystem Technologies, vol. 9, Nos. 1-2 / Nov. 2002, pp. 17-22.

Levinson, Harry J., "Principles of Lithography", SPIE, 2001, pp. 26-36, 83-84.

DWL66, Heidelberg Instruments sales presentation, Mar. 29, 2007, accessible at http://web.nchu.edu.tw/~dsw/book/49-3.pdf.

Intro to the Laser Writer and Auto Cad, Overview of Heidelberf DWL66 Laser Writer, accessible at http://people.bu.edu/bifano/EK130/PDF/EK131_Lab1_2008.pdf.

(Continued)

*Primary Examiner* — Christopher G Young
(74) *Attorney, Agent, or Firm* — Haynes Beffel & Wolfeld LLP; Ernest J. Beffel, Jr.

(57) ABSTRACT

The field of this disclosure is making three-dimensional topographic structures by means of graduated exposure in a photosensitive material, such as a photoresist, photosensitive polymide, or similar. Such patterns may be written either to be used directly as optical, mechanical, fluidic, etc. components, e.g. diffusors, non-reflecting surfaces, Fresnel lenses and Fresnel prisms, computer-generated holograms, lenslet arrays, etc, or to be used as masters for the fabrication of such components by replication. Replication can be done by molding, pressing, embossing, electroplating, etching, as known in the art. This disclosure includes descriptions of using passive absorbing components in thin resist, using high gamma thick resists with high resolution pattern generators, using multiple focal planes including at least one focal plane in the bottom half of the resist, and iterative simulation of patterning and adjustment of an exposure map.

17 Claims, 23 Drawing Sheets

OTHER PUBLICATIONS

International Search Report and Written Opinion, Appl. No. PCT/EP09/063827, mailed Apr. 15, 2010.

International Report on Patentablity, Appl No. PCT/EP09/063827, mailed Oct. 4, 2010.

International Search Report and Written Opinion of the International Search Authority for International Application No. PCT/EP2009/063831, dated Apr. 27, 2010, pp. 1-14.

International Search Report & Written Opinion, Appl. No. PCT/EP09/063826, mailed Apr. 15, 2010.

International Prelimnary Report on Patentability, International Application PCT/EP09/063826, mailed Sep. 24, 2010.

Mosher L et al.: "Double-Exposure Grayscale Photolithography", Journal of Microeletromechanical Systems, IEEE Service Center, Piscataway, NJ, US, vol. 18, No. 2, Apr. 1, 2009, pp. 308-315.

Kley E-B: "Continuous profile writing by electron and optical lithography" Microelectronic Engineering, Elsevier Publishers BV., Amsterdam, NL, vol. 34, No. 3-4, Dec. 1, 1997, pp. 261-298, XP004108294.

Lee S-Y et al: "Accurate control of remaining resist depth for nanoscale three-dimensional structures in electron-beam grayscale lithography"Journal of Vacuum Science and Technology: Part B, AVS I AIP, Melville, New York, NY, US, vol. 25, No. 6, Dec. 6, 2007, pp. 2008-2012, XP012105408ISSN: 1071-1023.

Kawata, Satoshi, et al., "Finer Features for functional microdevices", Nature, vol. 412, Aug. 16, 2001 pp. 697-698.

*Prior art*

MULTI-FOCUS METHOD OF ENHANCED THREE-DIMENSIONAL EXPOSURE OF RESIST

RELATED APPLICATIONS

This application claims the benefit of U.S. Provisional Patent Application No. 61/107,581, entitled, "Method of Iterative Compensation for Non-Linear Effects in Three-Dimensional Exposure of Resist," filed on 22 Oct. 2008.

This application further claims the benefit of U.S. Provisional Application No. 61/107,588, entitled "Method of Compensation for Bleaching of Resist During Three-Dimensional Exposure of Resist," filed on 22 Oct. 2008.

The application further claims the benefit of U.S. Provisional Application No. 61/107,591, entitled "Multi-Focus Method of Enhanced Three-Dimensional Exposure of Resist," filed on 22 Oct. 2008. All these provisional applications are hereby incorporated by reference for all purposes.

This is one of three applications filed contemporaneously. The three are entitled, "Method of Iterative Compensation for Non-Linear Effects in Three-Dimensional Exposure of Resist," application Ser. No.12/604,317; "Method of Compensation for Bleaching of Resist During Three-Dimensional Exposure of Resist," application Ser. No. 12/604,313; and "Multi-Focus Method of Enhanced Three-Dimensional Exposure of Resist," application Ser. No. 12/604,312.

Three PCT applications of the same titles also have been filed in English and designating the United States on Oct. 21, 2009 by applicant Micronic Laser Systems. The contemporaneously filed US applications and recently filed PCT applications are hereby incorporated by reference for all purposes.

BACKGROUND OF THE INVENTION

The field of this disclosure is making three-dimensional topographic structures by means of graduated exposure in a positive-tone photosensitive material, such as a photoresist, photosensitive polymide, or similar. Typically the produced surfaces have a surface profile which is non-reentrant, i.e. for each lateral point (x, y) the surface has only one height z(x,y) or there may be points where the surface is approximately vertical (perpendicular to the xy plane). Alternatively they may be said to have only positive slopes (including approximately 90 degrees to the xy plane, but no significantly negative (overhanging) slopes. The surfaces may be called 2.5D surfaces since they have more dimensions than the xy plane, but are significantly more constrained than a 3D surface. Many relevant surfaces will have only positive slopes.

Such 2.5D patterns may be written in positive resist either to be used directly as optical, mechanical, fluidic, etc. components, e.g. diffusors, non-reflecting surfaces, Fresnel lenses and Fresnel prisms, computer-generated holograms, lenslet arrays, etc, or to be used as masters for the fabrication of such components by replication. Replication can be done by molding, pressing, embossing, electroplating, etching, as known in the art.

Creating a three-dimensional profile in resist is a non-linear process. The depth of resist removed by development is not linearly proportional to the exposure dose. Instead, the input pattern may be specified as a depth after development and a method applied to translate the specified depth, using a calibrated look-up table or mathematic expression, into an exposure dose. The exposure dose creates a latent image that is developed in an effort to give the desired depth profile. Useful and compact introductions to resist exposure and development can be found at http://www.microchemicals.eu/ technical-information, especially the articles entitled "Exposure of Photo Resists," 5 pp. revised 2007-03-12; "Optical Parameters of Photoresists," 2 pp., revised 2007-02-26; and "Development of Photoresists," 3 pp., revised 2007-02-28, which are hereby incorporated by reference.

A small variation in amounts of exposure dose gives a relatively small change in dissolution rate during development, but not a linearly proportional change. It is difficult to control the depth with an accuracy of +/−1%, which may be required for optical surfaces. The depth after development will be affected by small disturbances, such as the baking temperature of the resist, fluctuations of the laser power, thickness variations of the resist, agitation of the developer, etc. The dose errors are often lumped together with sensitivity fluctuations and developer activity variations. The combined equivalent dose error is typically within the range of 1-5%. A process based on controlling the dissolution rate in the developer by the exposure dose is difficult to keep stable and needs frequent recalibrations. Even with recalibration, a process that depends on a closely controlled dissolution rate and time will not consistently produce results within +/−1% of the ideal feature.

FIG. 1 shows a process for creating a 2.5D surface structure on a workpiece by means of varying exposure of a photoresist as known in the art. In FIG. 1a, a positive-tone photoresist 101 is applied to a workpiece 102. In FIG. 1b, the resist is exposed to electromagnetic radiation 103 with higher 104 and lower 105 exposure dose in an exposure system 106. In FIG. 1c, the developer 107 dissolves part of the resist. Areas exposed to a higher dose 104 dissolve faster than areas exposed with less dose 105, creating a three-dimensional surface pattern 108, as depicted in FIG. 1d. The profile can be used directly (as shown in FIG., scattering light in a controlled fashion.) It can be transferred into a material with more durable or otherwise more suitable properties 109, as in FIG. 1f. It can be used for replication of the three-dimensional pattern 110, as shown in FIG. 1g.

Positive tone in this disclosure means that the developer removes resist that is exposed above a certain dose, the threshold. Resists with high contrast (high gamma) have a sharp on-set of dissolution at the threshold dose, while for resist with low contrast (low gamma) the dissolution rate is more proportional to the dose. This is illustrated in the article, "Exposure of Photo Resists," supra, available at http://www.microchemicals.eu/technical-information. The article posits that grey scale lithography uses low contrast resist, rather than high contrast resist.

Negative-tone resists, e.g., SU-8, become insoluble with increasing exposure dose. Since there is always some absorption in the resist the dose is higher at the top surface than close to the substrate, and it is only when the resist is fully exposed that it will adhere to the substrate after development. Partially exposed features or areas will fall off or peel during development or rinsing. Therefore negative-tone resists tend to be less suitable to the writing of 2.5D surfaces.

The problem with the prior process depicted in FIG. 1 is its sensitivity to disturbances. Slight variations in the dose, such as variations due to laser noise, and variations in the resist properties or the developer agitation, cause depth variations in the finished profile. Likewise, the time and temperature control during development is critical.

An opportunity arises to introduce new processes for controlling the depth and shape of features exposed in a relatively thick resist layer, preferably with an accuracy of +/−1%. Better, more easily controlled 2.5D feature formation may result.

Figure 1A:
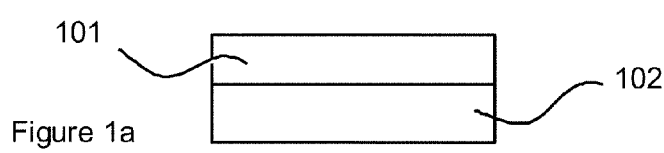
In FIG. 1a, a photoresist 101 is applied to a workpiece 102.
Figure 1B:
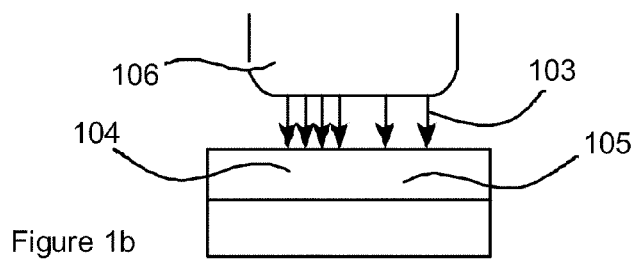
FIG. 1 shows a process to make a three-dimensional pattern in a positive resist as known in the art.

The resist is exposed to electromagnetic radiation 103 with higher 104 and lower 105 exposure dose in an exposure system 106, FIG. 1b.

Figure 1C:
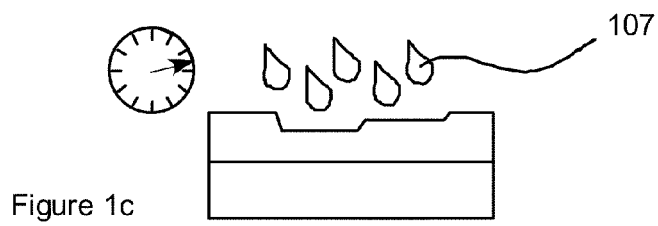

In FIG. 1c, the developer 107 dissolves part of the resist.

Figure 1D:
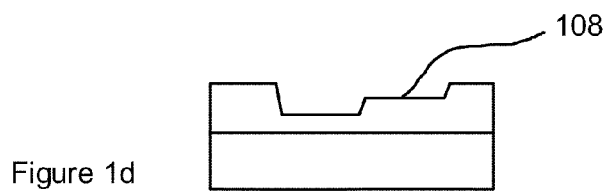

Areas exposed to a higher dose 104 dissolve faster than areas exposed with less dose 105, creating a three-dimensional surface pattern 108, FIG. 1d.

Figures 1E, 1F, 1G:
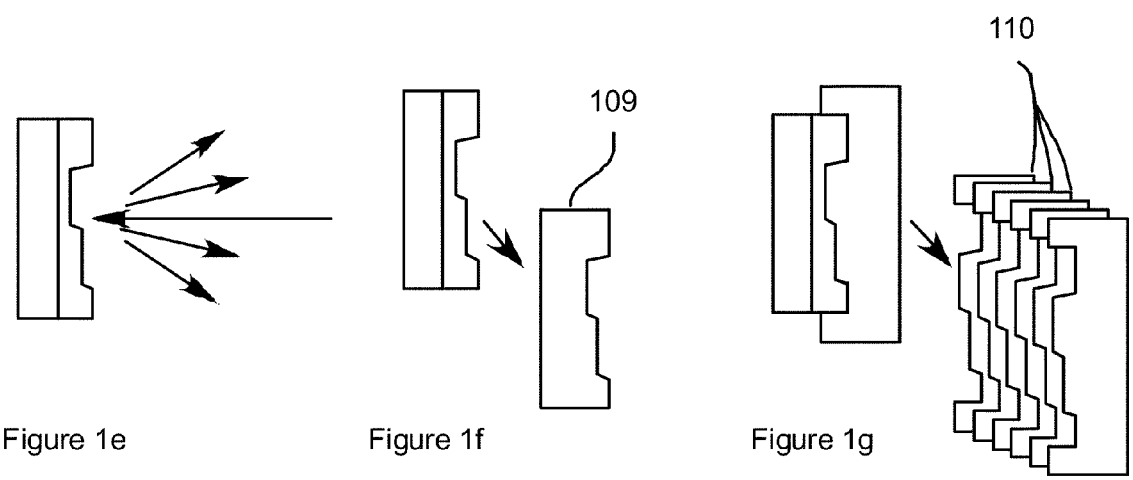

The profile can be used directly (here shown to scatter light in a controlled fashion, FIG. 1e), transferred into a material with more durable or otherwise more suitable properties 109, FIG. 1f, and/or used for replication of the three-dimensional pattern 110 as shown in FIG. 1g.

Figure 2A:
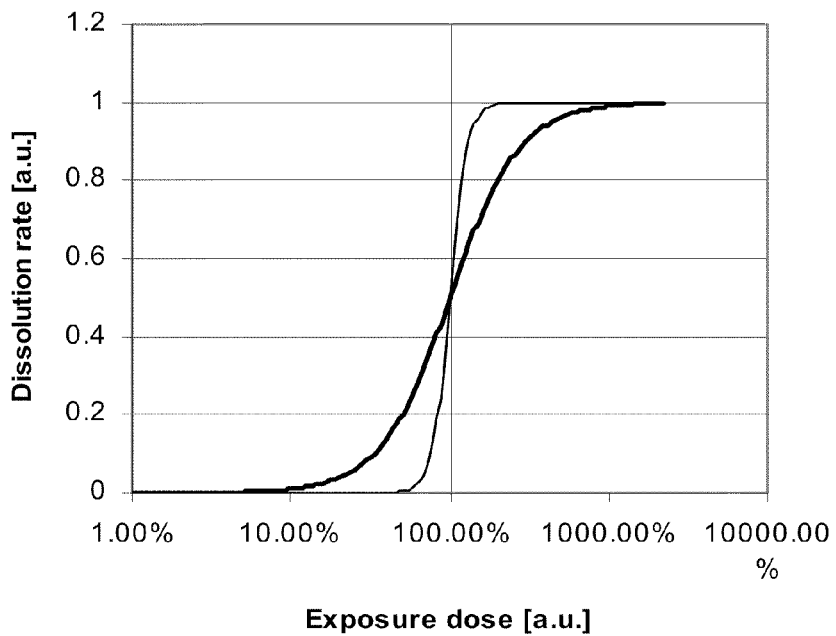

FIG. 2a shows a diagram of the dissolution rate versus dose for two different resist-developer systems.

Figure 2B:
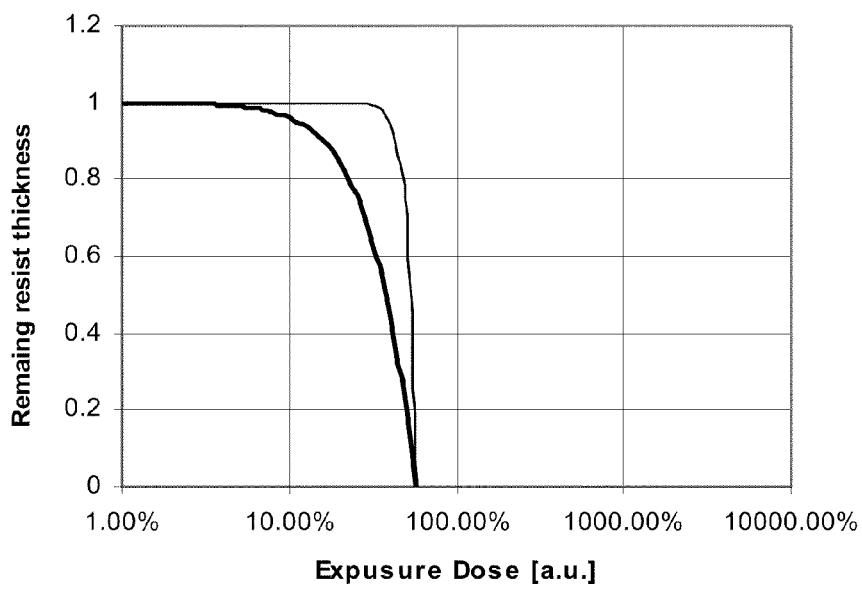

FIG. 2b shows a diagram of the remaining resist thickness after development of the two resist systems in FIG. 2a.

Figure 2C:
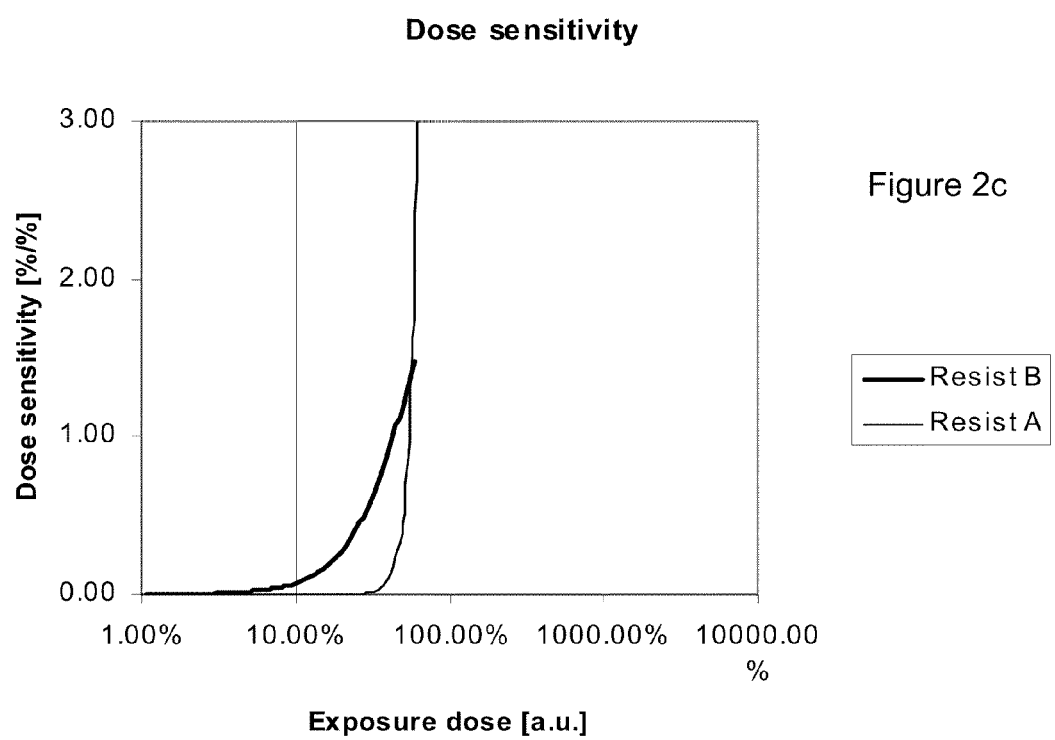

FIG. 2c shows the dose sensitivity of the resists in FIG. 2a.

Figure 3A:
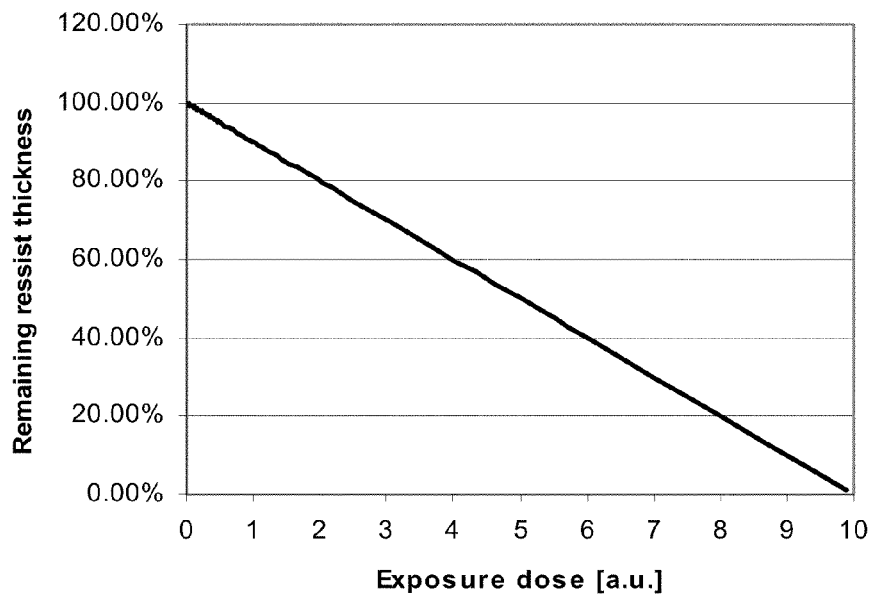

FIG. 3a shows a diagram of the remaining resist thickness after development of a resist dominated by bleaching.

Figure 3B:
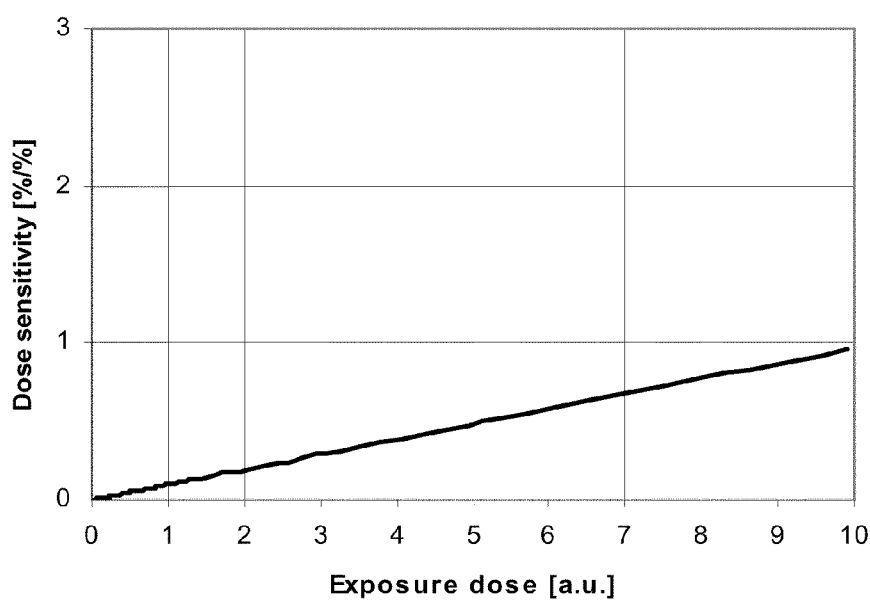

FIG. 3b shows the dose sensitivity of the resists in FIG. 3a.

Figure 4A:
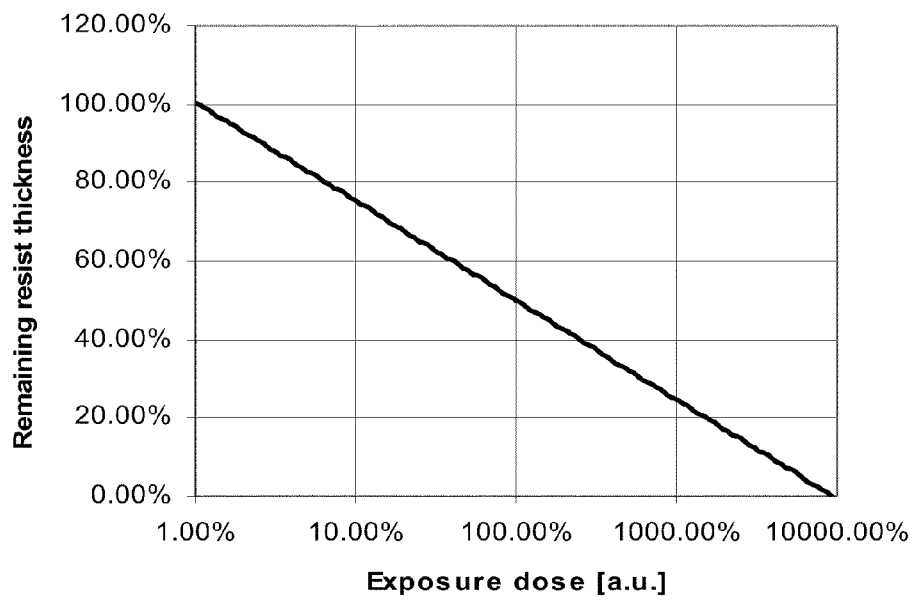

FIG. 4a shows a diagram of the remaining resist thickness after development of a resist dominated by absorption.

Figure 4B:
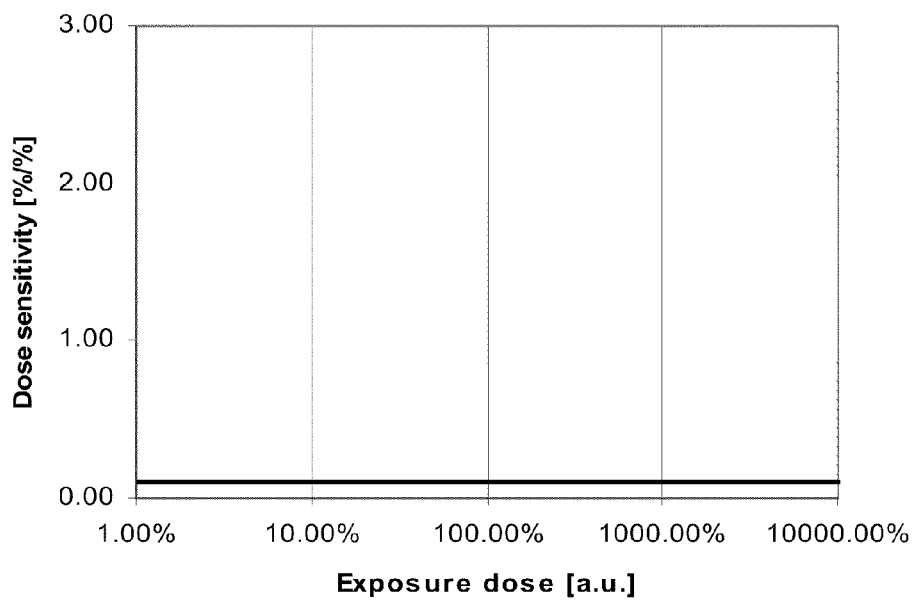

FIG. 4b shows the dose sensitivity of the resists in FIG. 4a.

Figure 5:
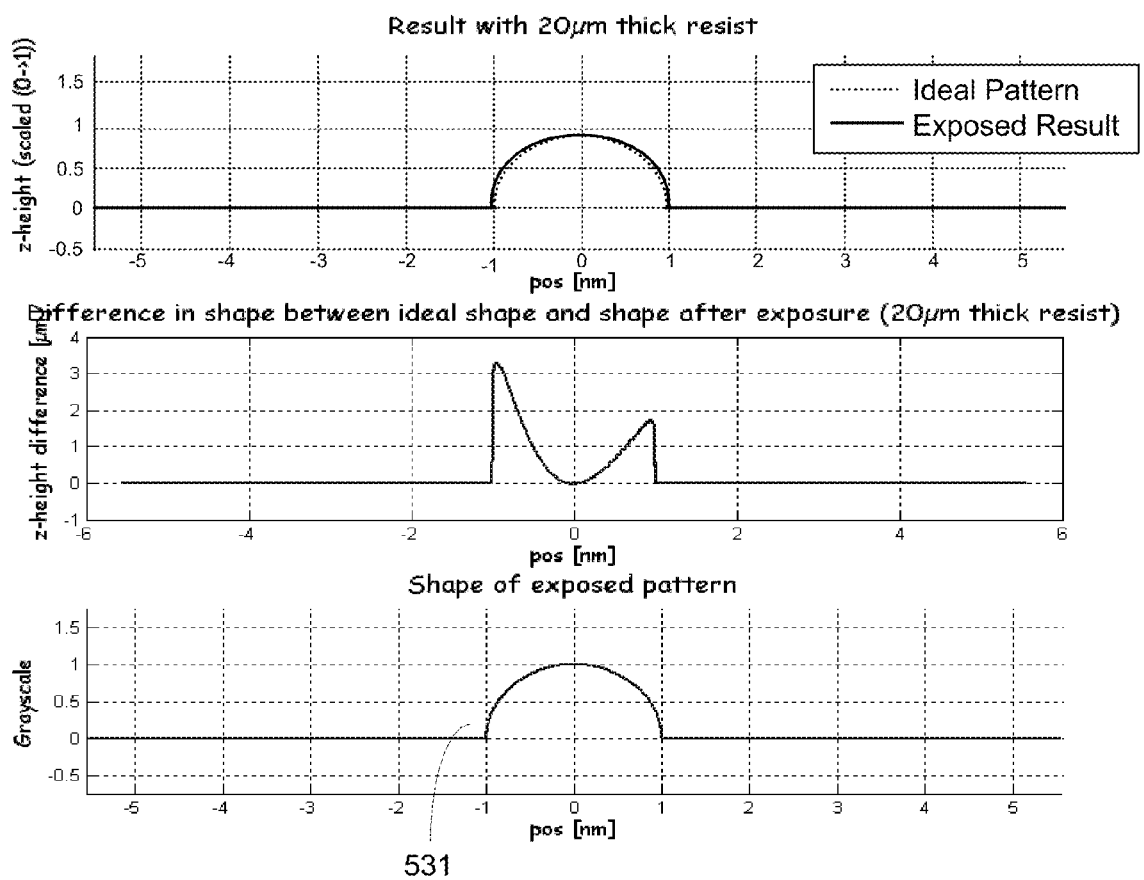

FIG. 5 depicts a simulated semi-sphere, after development, written using a laser scanning system and 20 μm thick resist.

Figure 6:
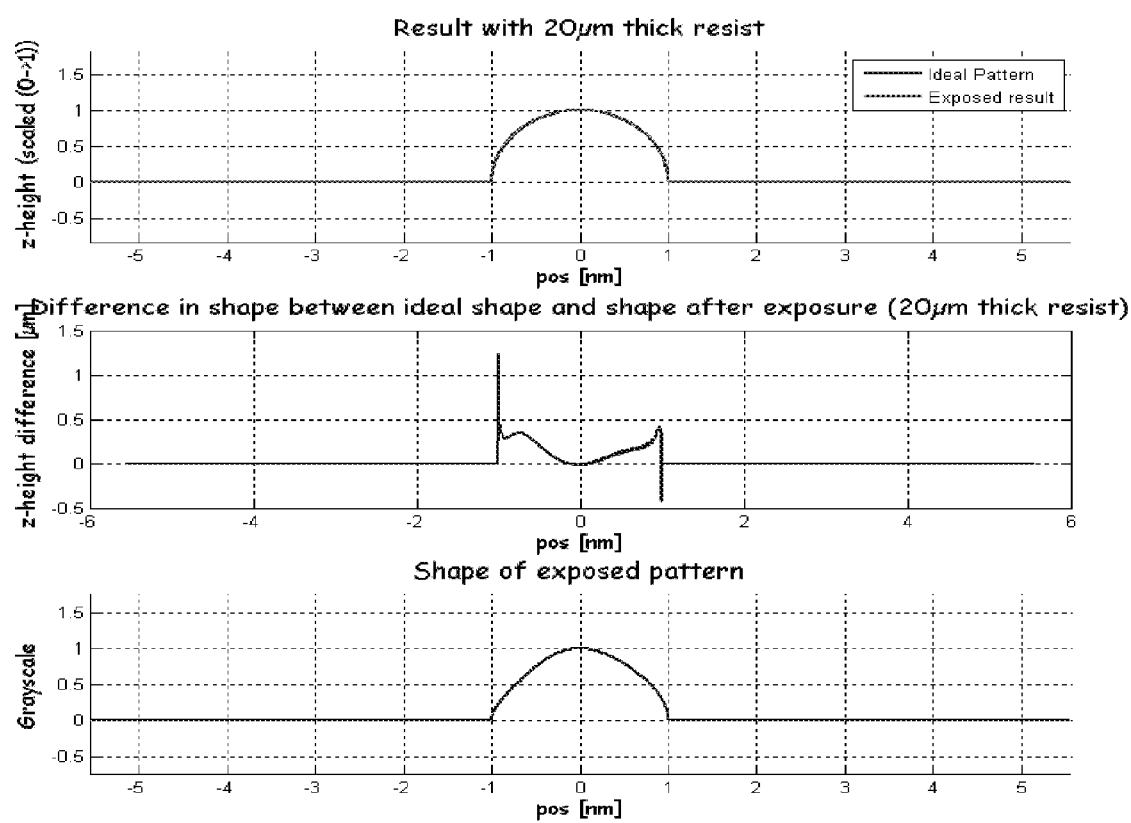

FIG. 6 depicts improved faithfulness of the latent image to the ideal, after 5 iterations of simulation and exposure adjustment.

Figure 7:
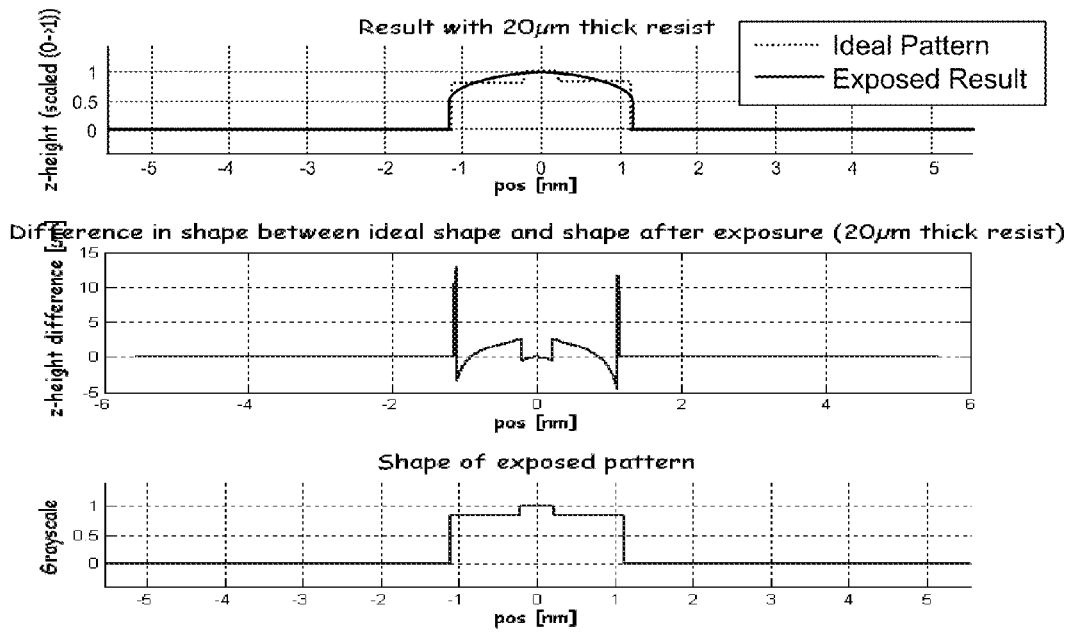
Figure 8:
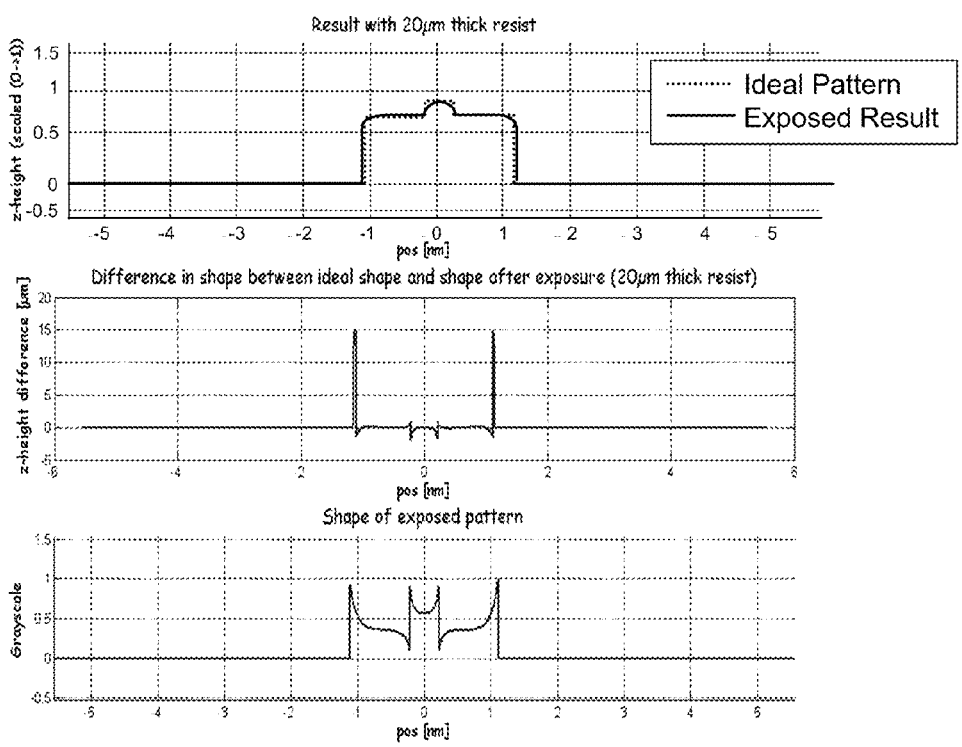

FIGS. 7-8 depict uncorrected and corrected exposure to produce a latent image with one box set on top of another. FIG. 7 shows the result of applying an exposure that matches desired result.

FIG. 8 depicts the improved exposure pattern and result after 10 iterations of modeling and exposure pattern adjustment.

Figure 9:
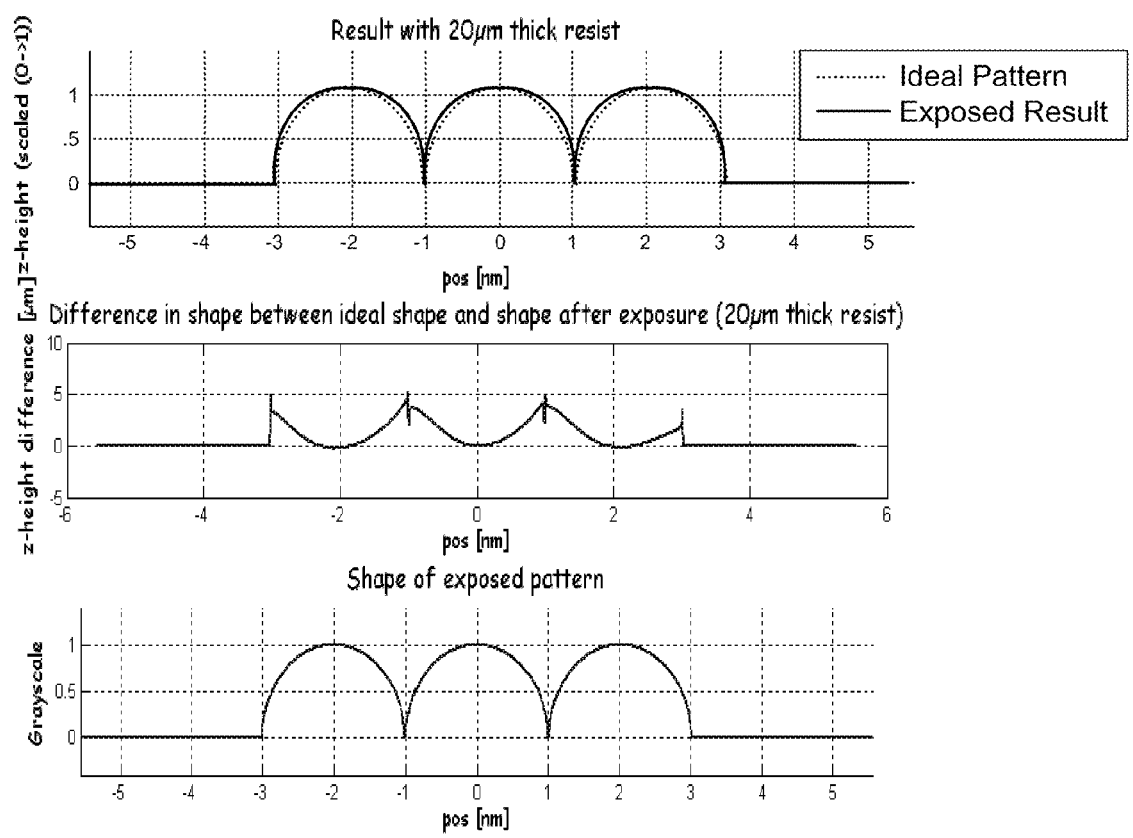
Figure 10:
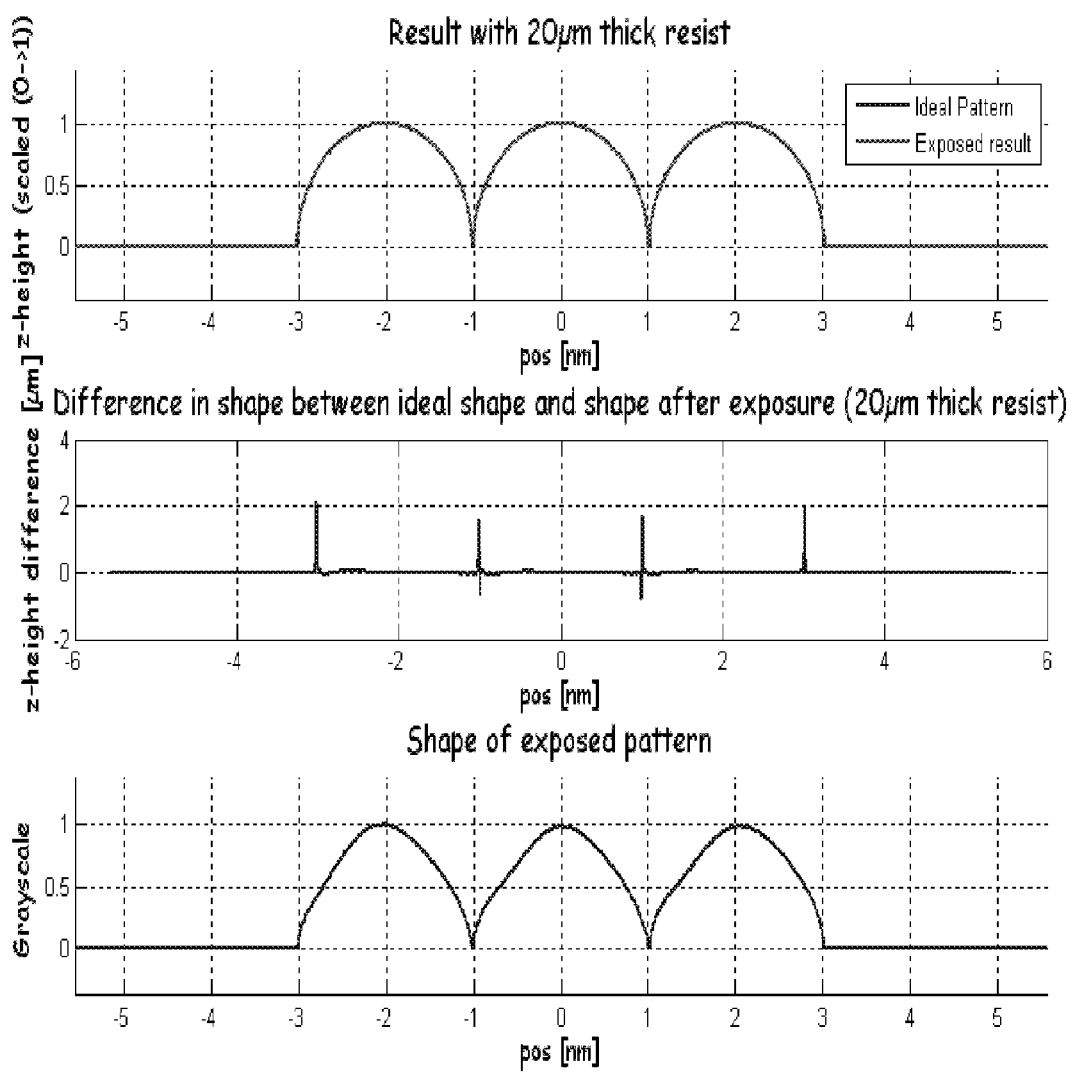

FIGS. 9-10 depict uncorrected and corrected exposure to produce a latent image of three rounded features in a row. FIG. 9 shows the result of applying an exposure that matches desired result.

FIG. 10 depicts the improved exposure pattern and resulting latent image after 10 iterations of modeling and exposure pattern adjustment.

Figure 11:
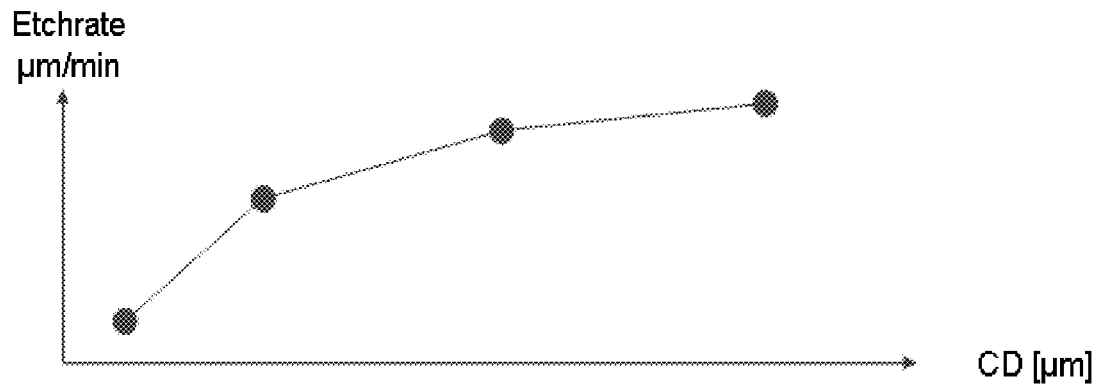

FIG. 11 illustrates use of a reduced etch rate to improve feature critical dimension (CD) accuracy.

Figure 12:
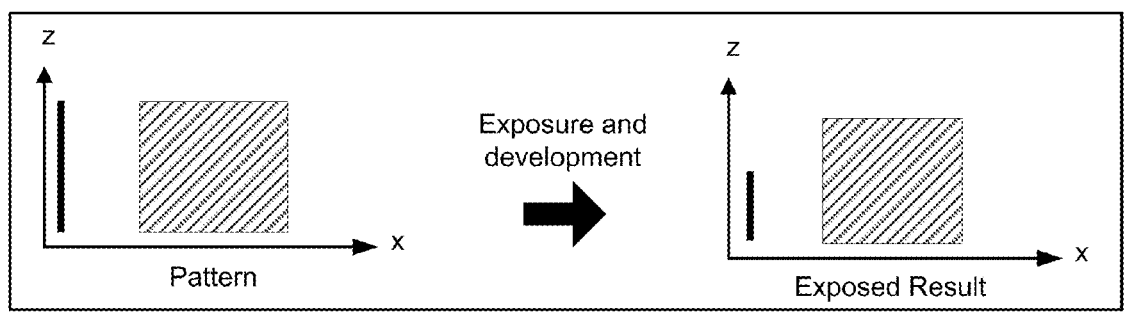

FIG. 12 illustrates collecting data regarding the effect of etch rate as function of feature CD.

Figure 13:
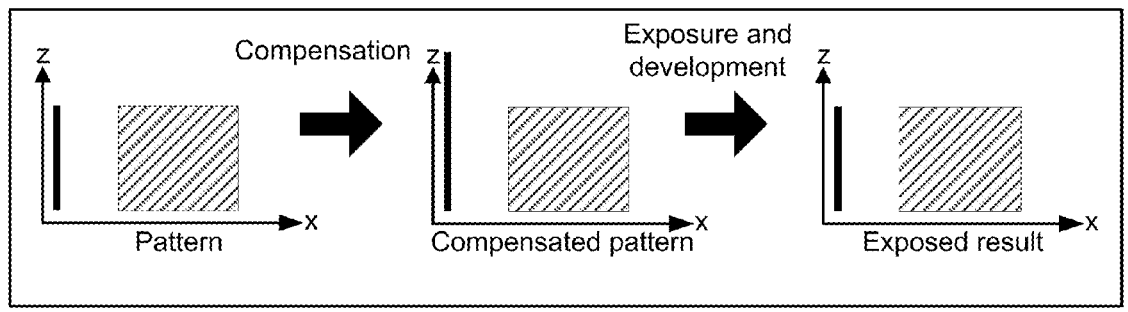

FIG. 13 illustrates compensation based on the data collection illustrated by

FIG. 12 and result of this compensation.

Figure 14:
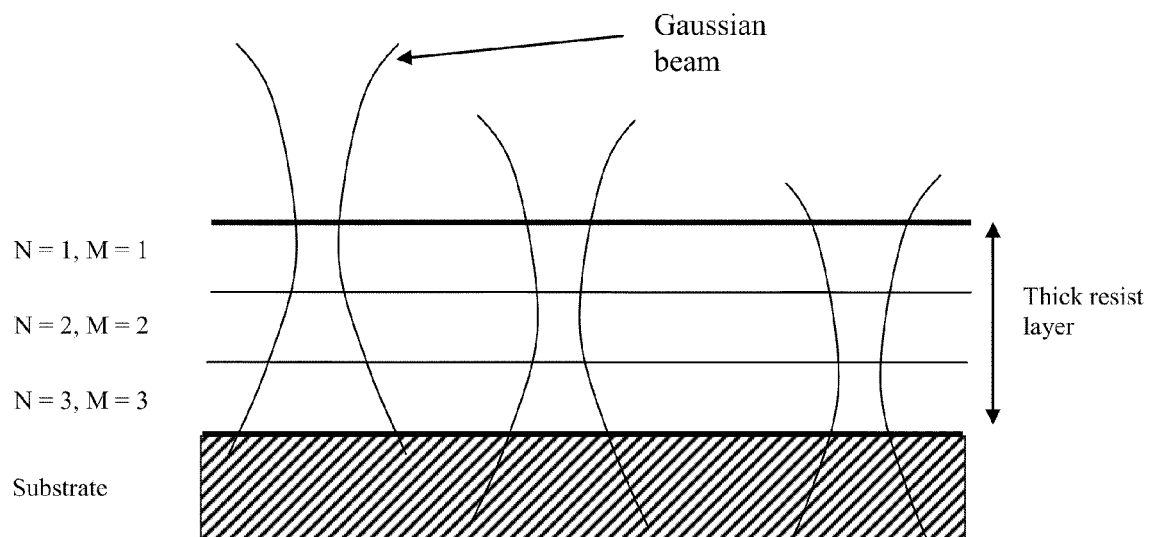

FIG. 14 illustrates M=3 different planes.

Figure 15:
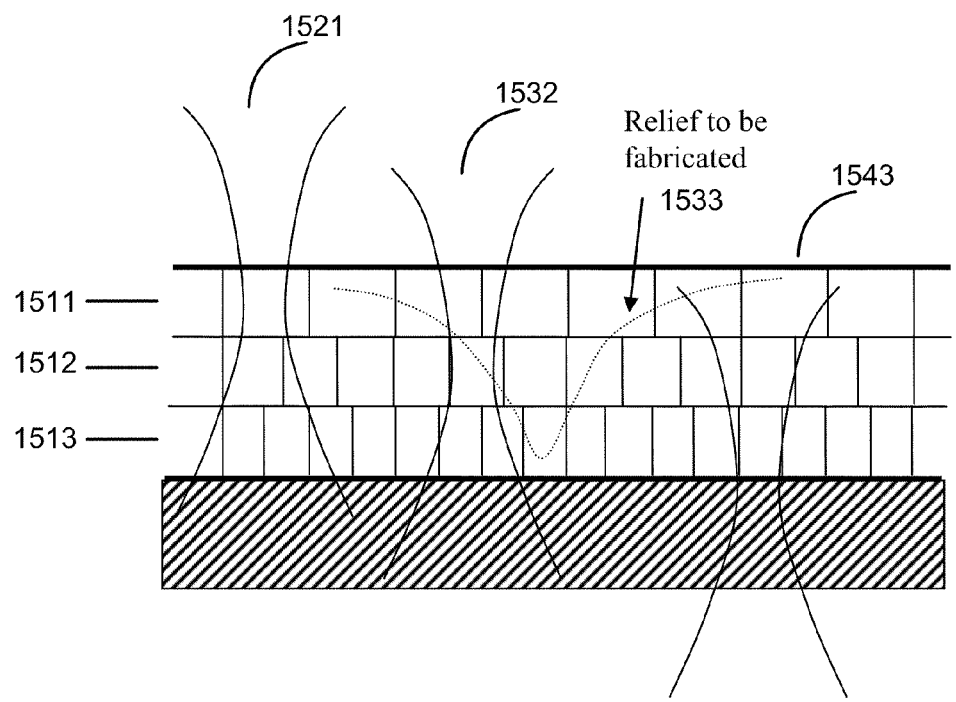

FIG. 15 adds to FIG. 14 a representation of varying pixel sized in different exposure phases.

Figure 16:
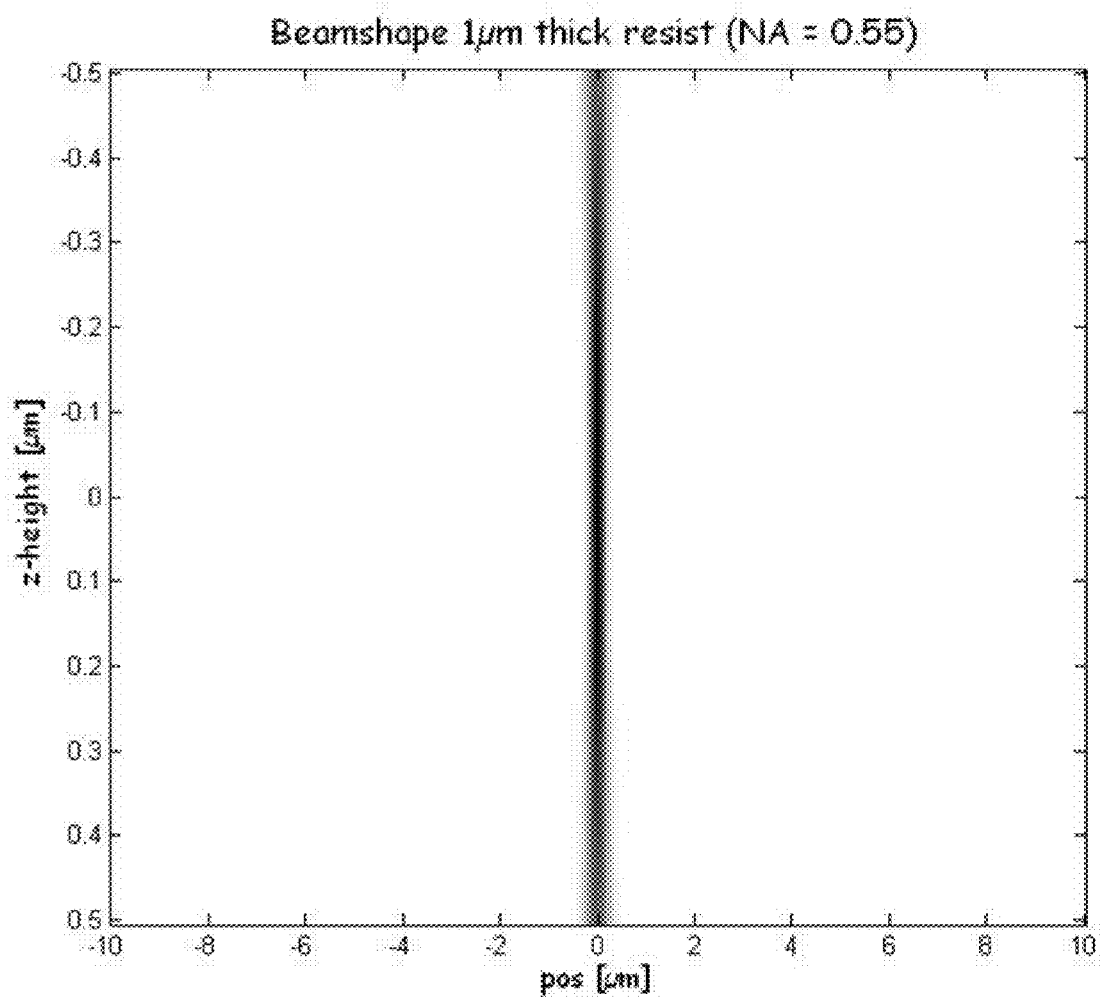
Figure 17A:
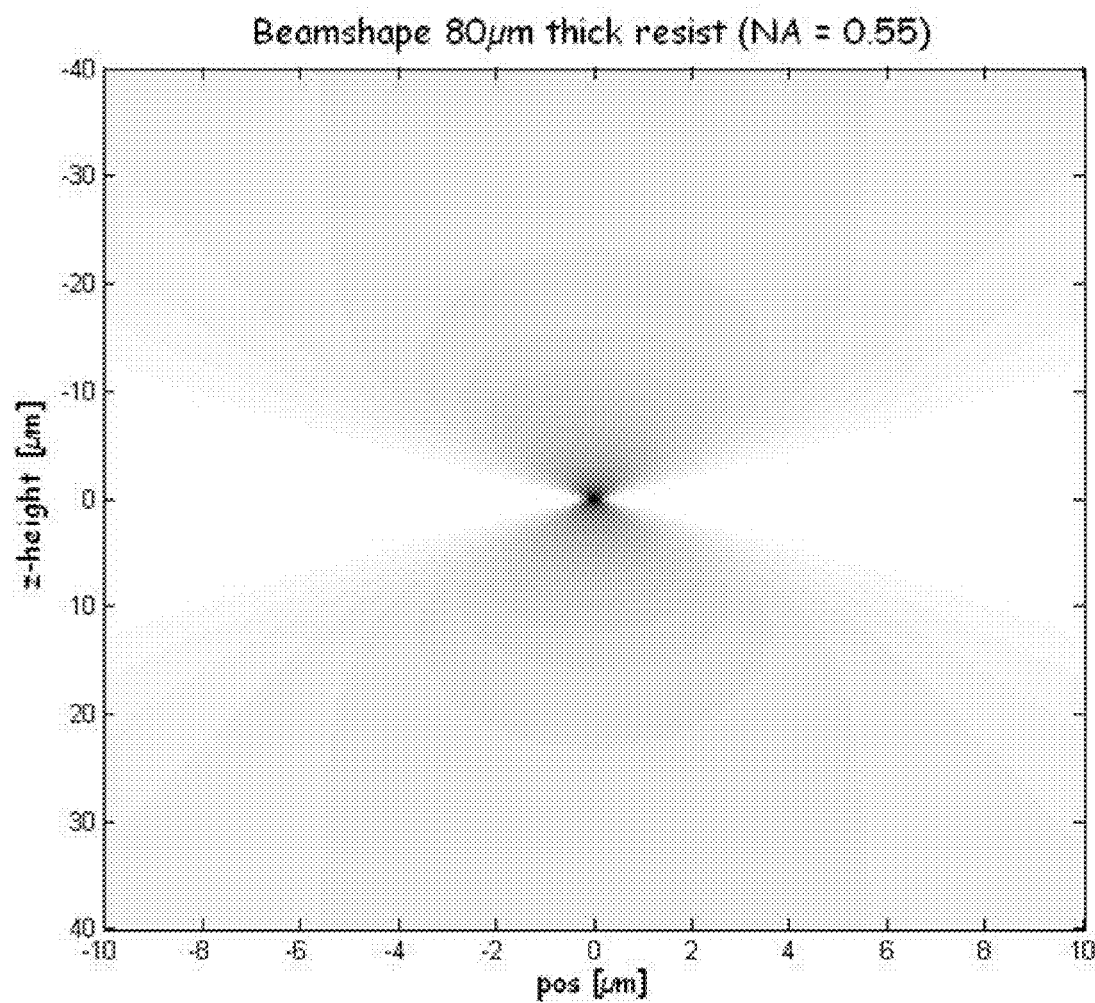
Figure 17B:
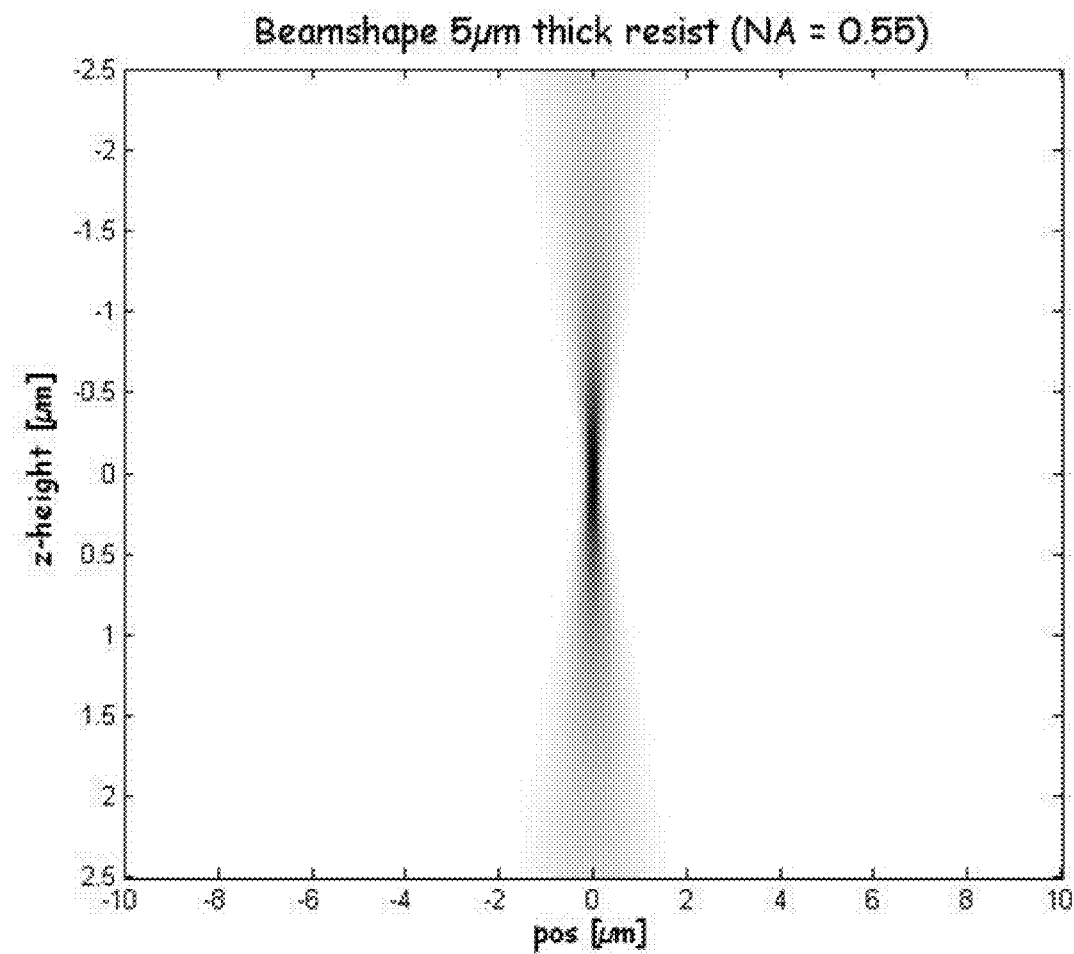

FIGS. 16 and 17A depict beam divergence patterns in resist layers that are 1 and 80 μm thick, respectively. FIG. 17B is an enlargement of a section of the 80 μm thick resist divergence pattern, that shows a section 5 μm thick, from the center of the thicker layer.

Figure 18:
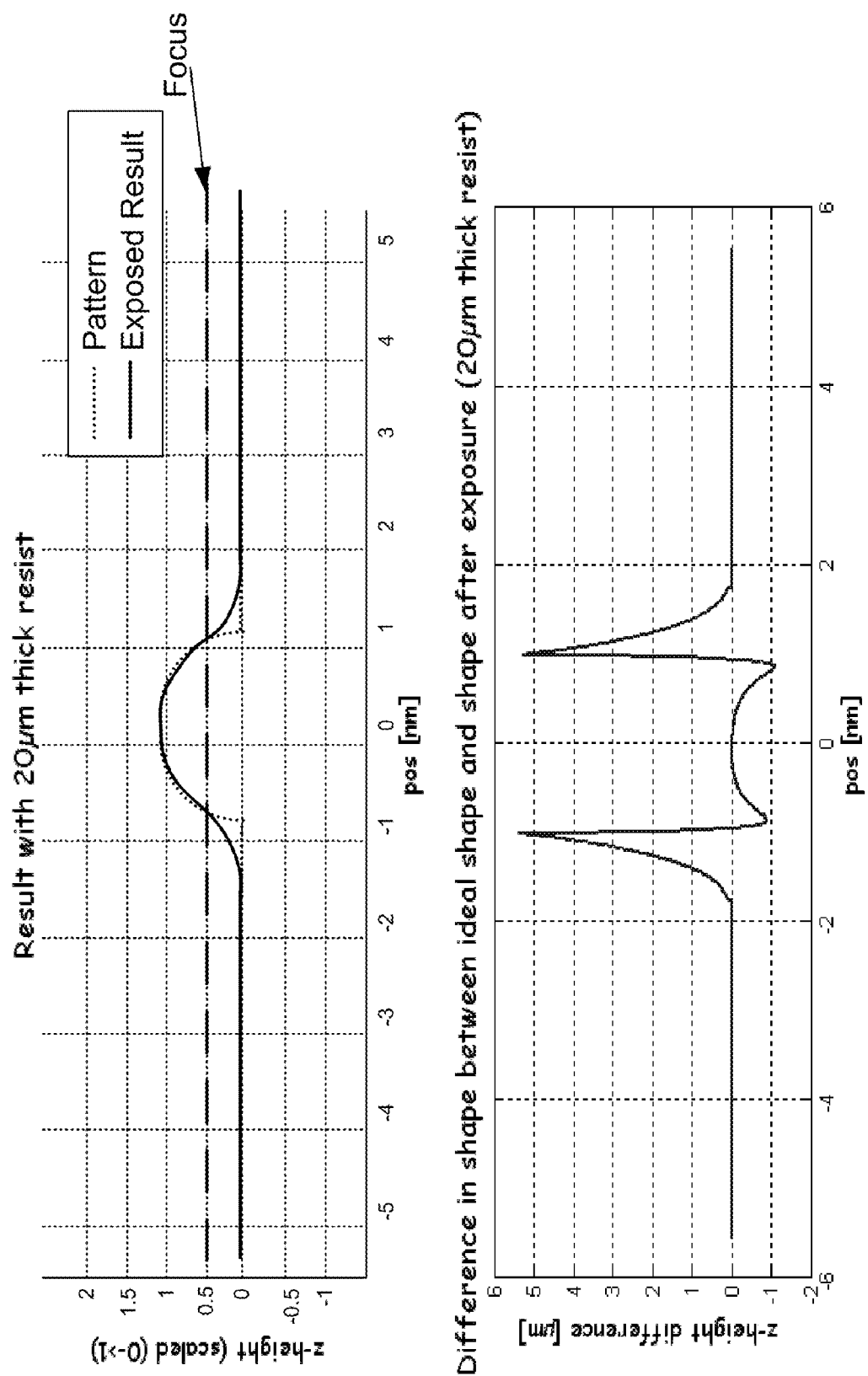

FIG. 18 shows the difference between ideal and exposed in a 20 μm resist layer, when the focal plane is set at 10 μm.

Figure 19:
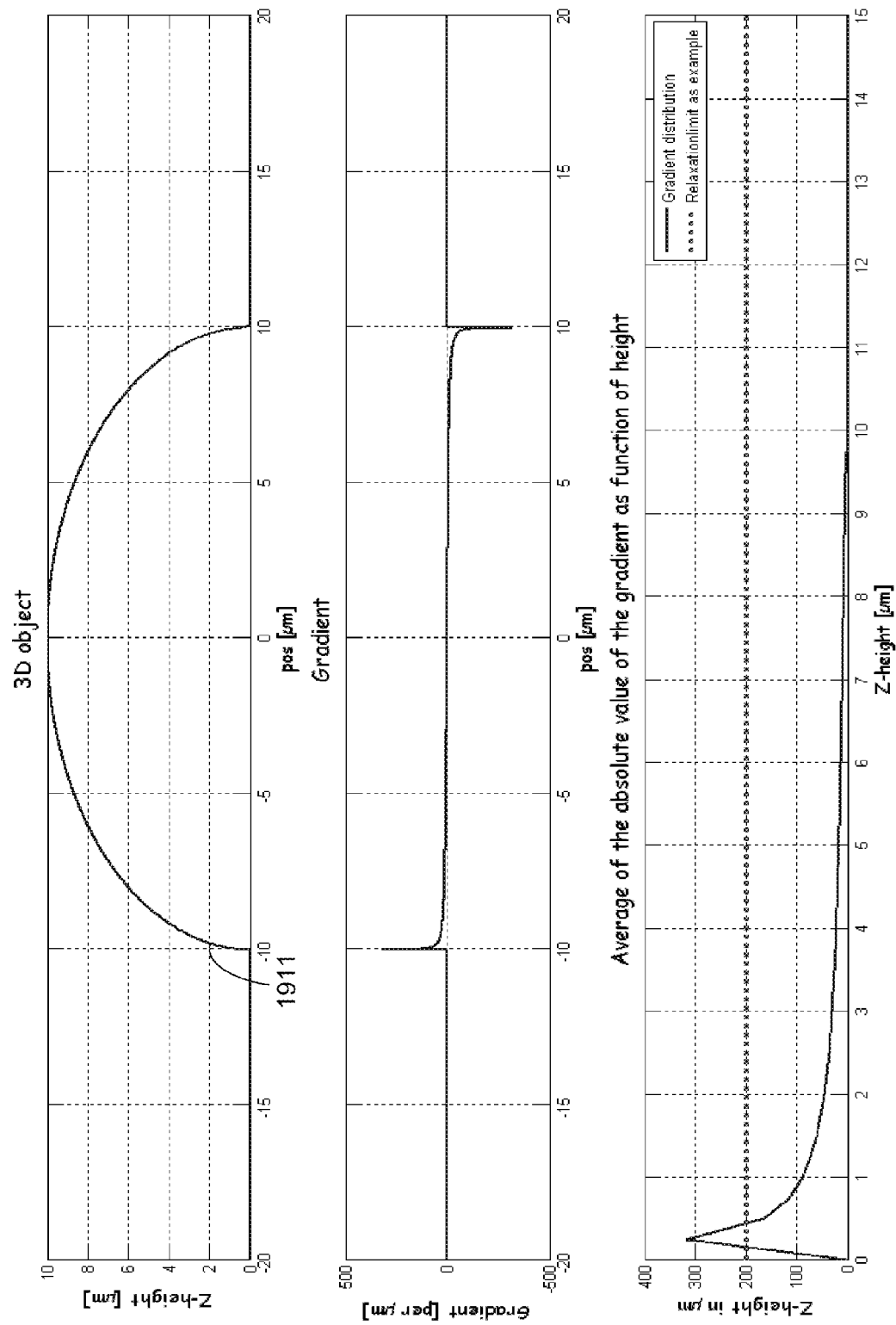

FIG. 19 applies a focal plane selection algorithm to the semi-sphere pattern, depicting gradients and the gradient distribution.

Figure 20:
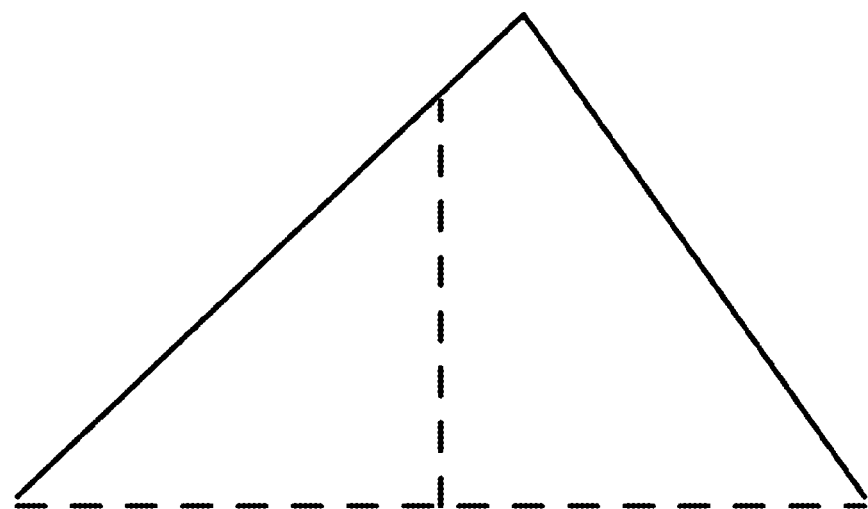

FIG. 20 selection of a focal plane.

Figure 21:
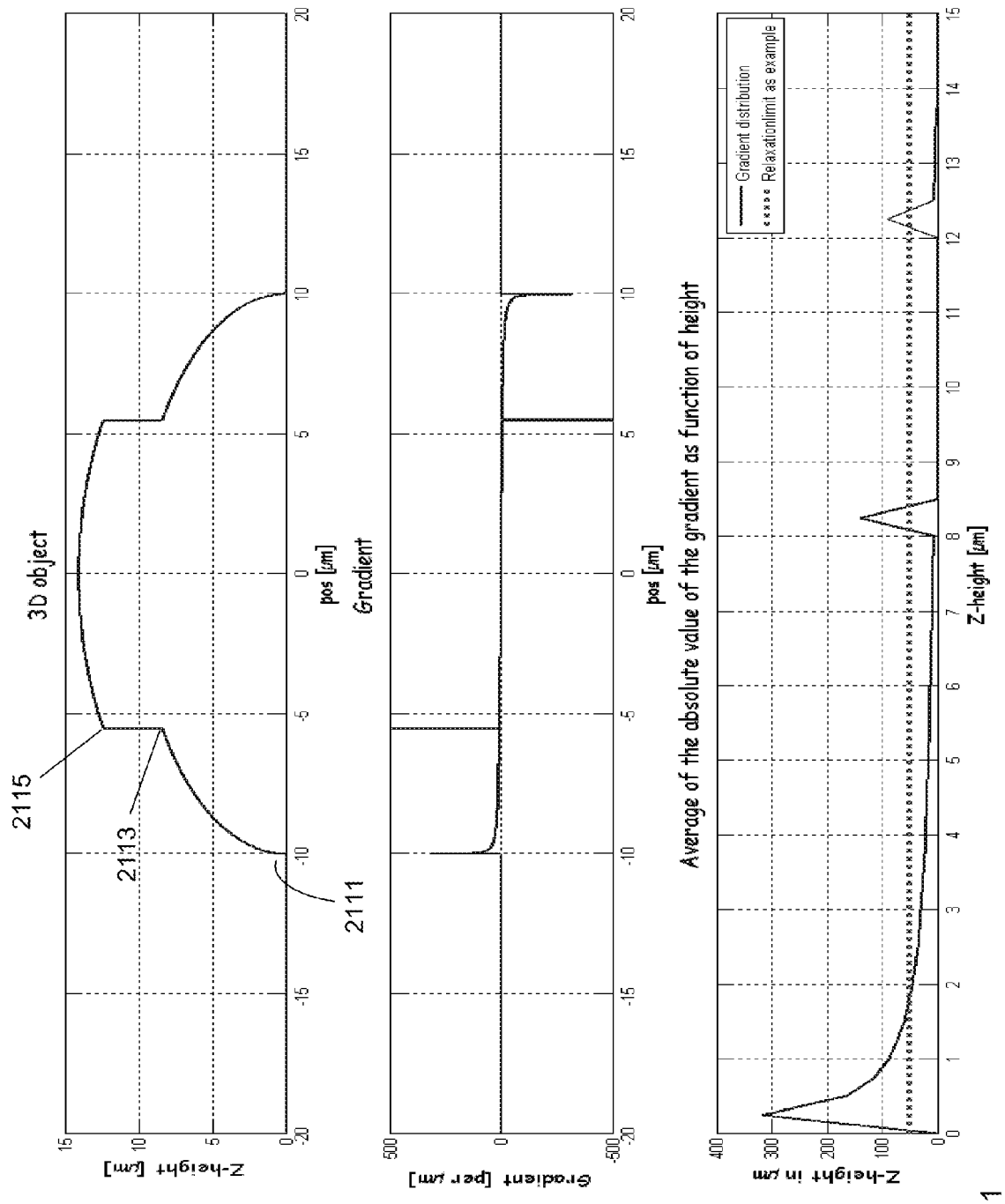

FIG. 21 a feature with multiple vertical corners, for which multiple focal planes are preferred.

Figure 22:
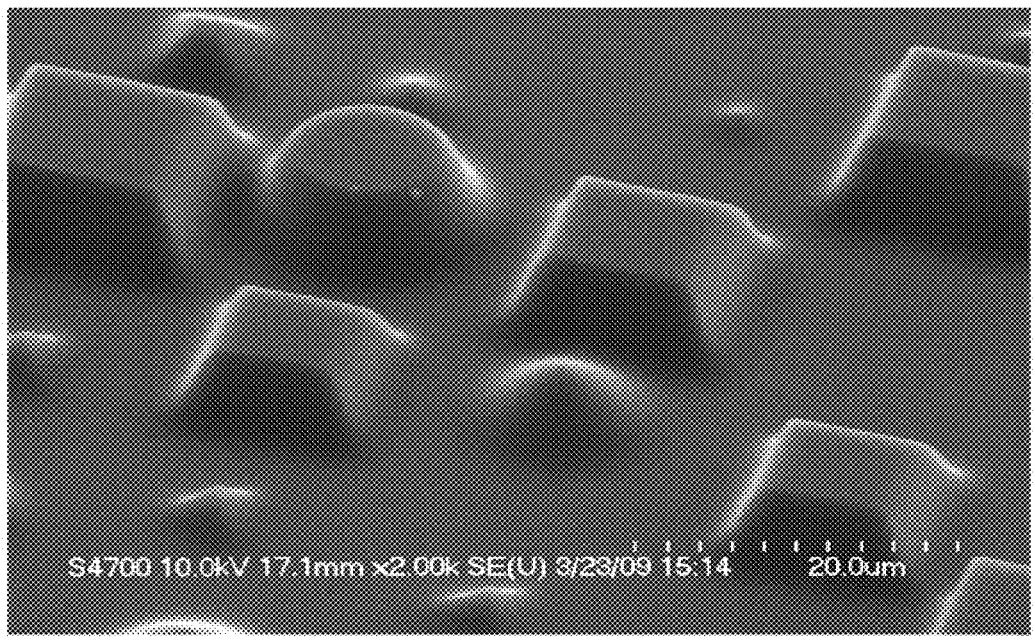
Figure 23:
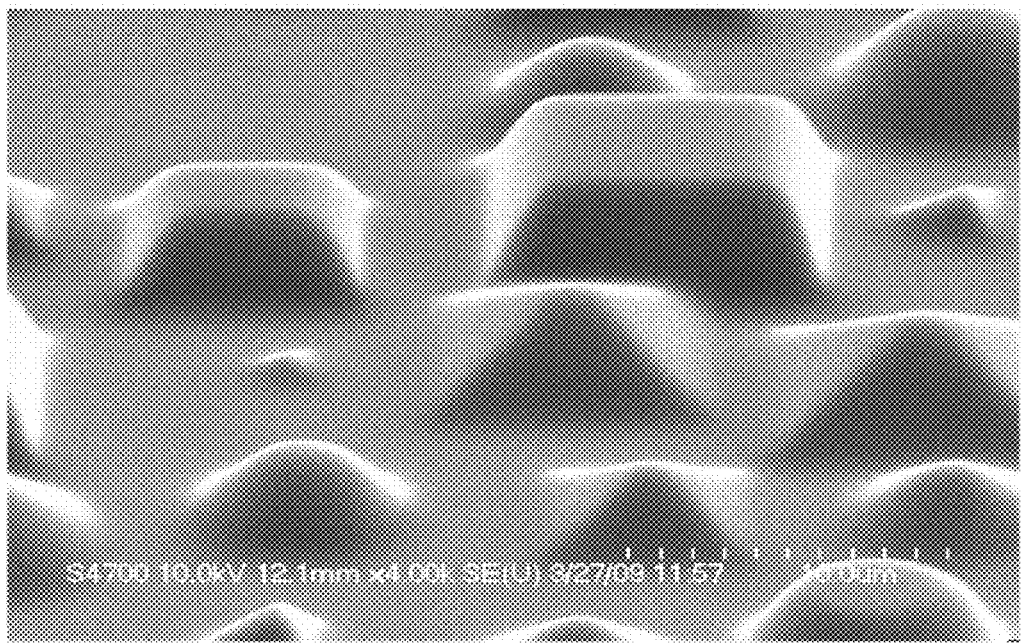

FIGS. 22-23 are photo micrographs of resist features actually produced, with better and worse focal plane positions.

Figure 24:
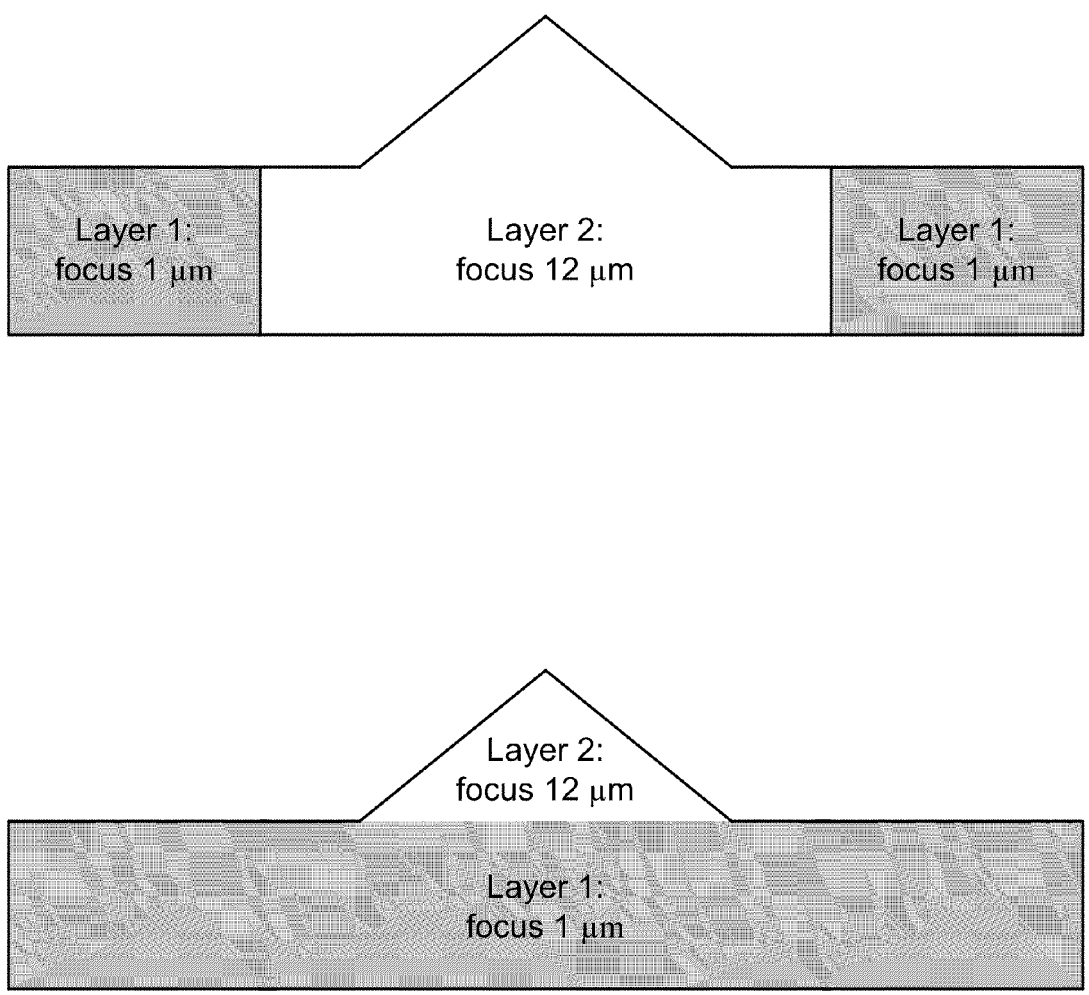

FIG. 24 illustrates alternative partitions between focal planes, in cases of one and two writing passes.

Figure 25:
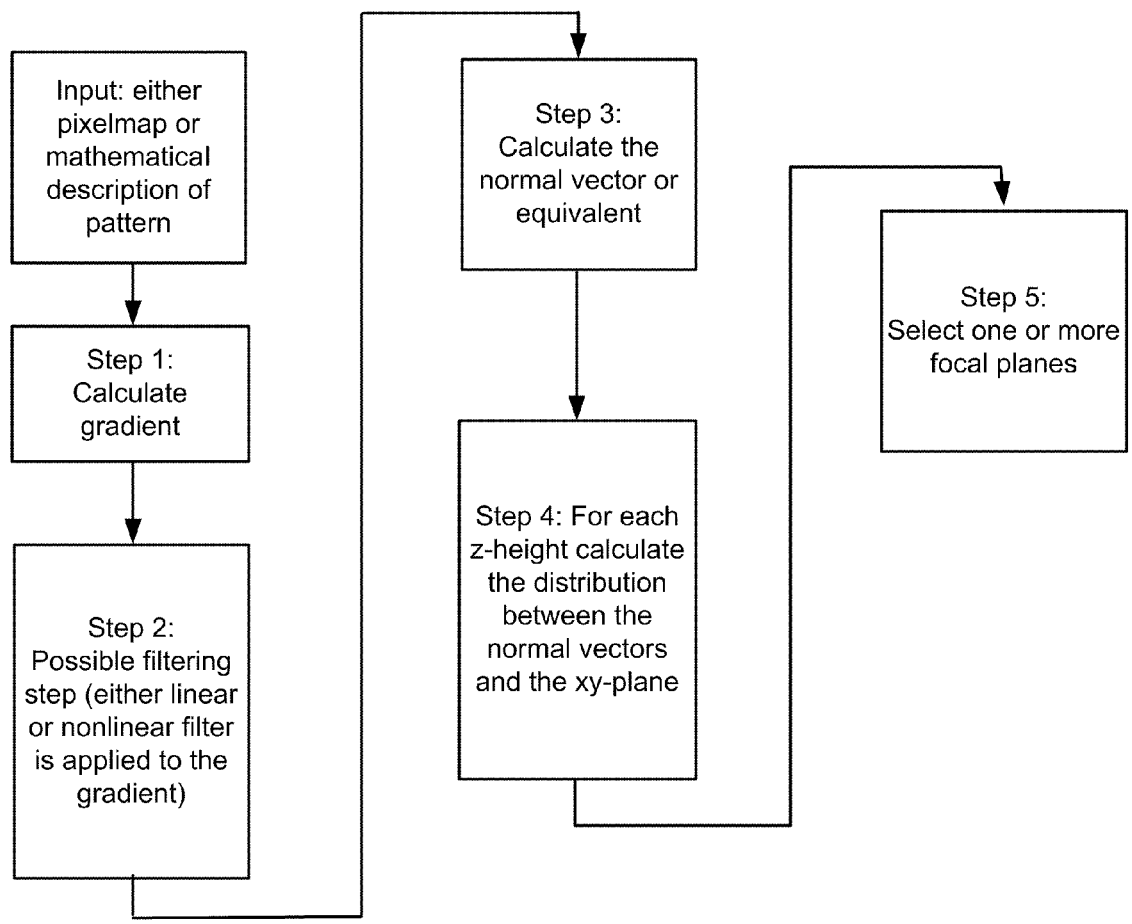

FIG. 25 shows a flow chart of a focal plane algorithm.

Figure 26:
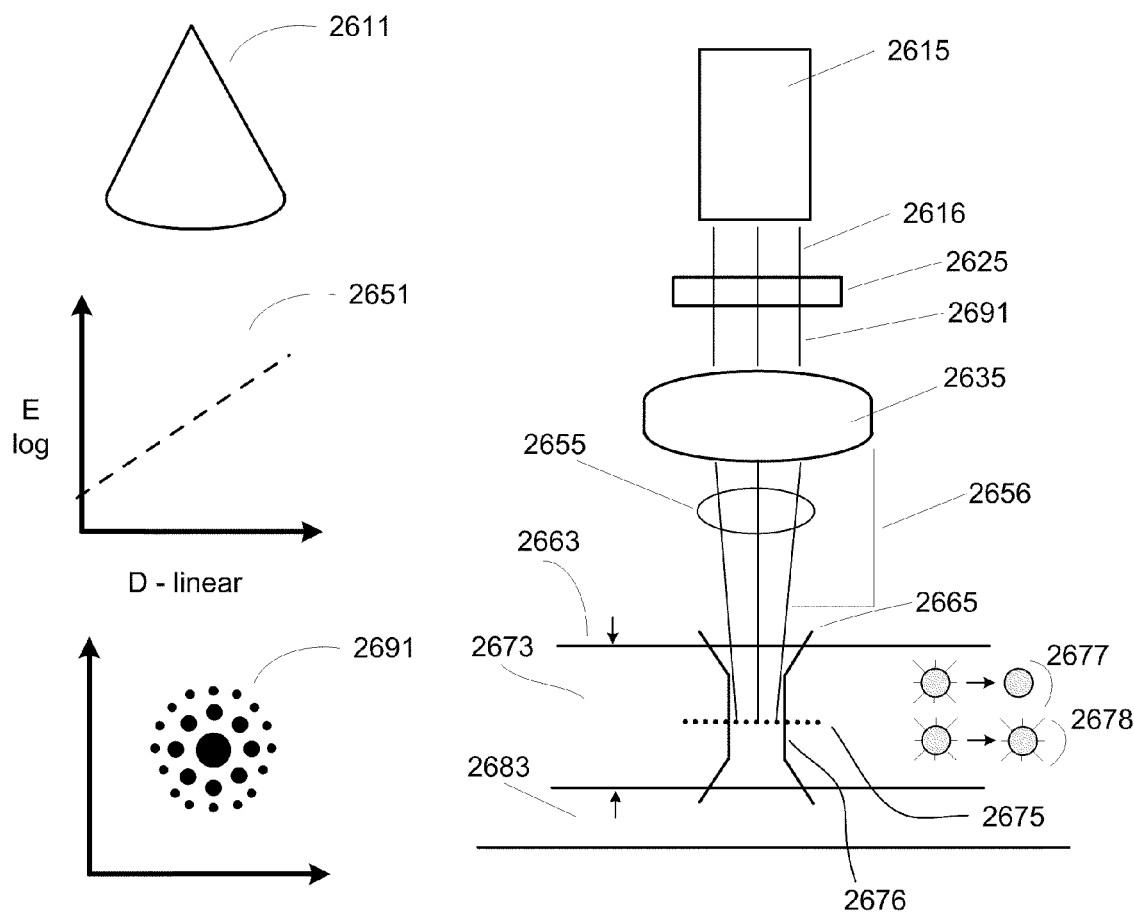

FIG. 26 depicts a method and device for writing thin resist.

Figure 27:
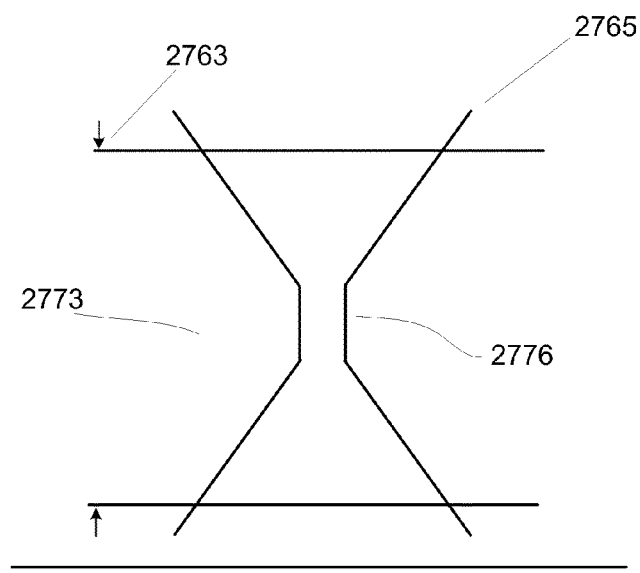

FIG. 27 extends the method and device of FIG. 26 to thick resist.

Figure 28:
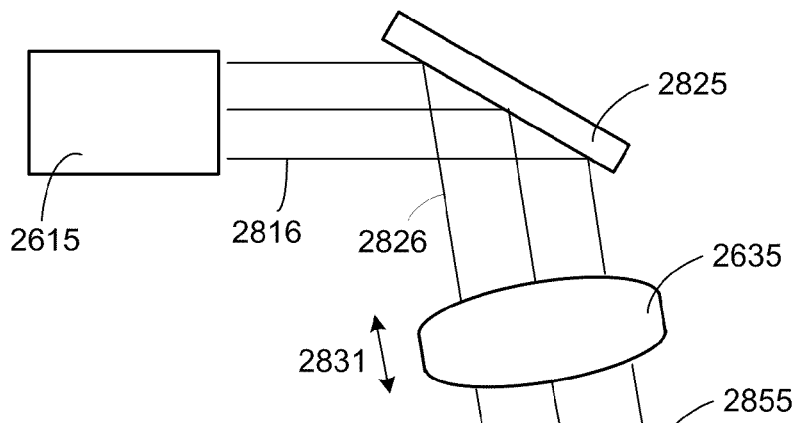

FIG. 28 depicts writing to multiple focal planes, which could be in either thin or thick resist.

Figure 29:
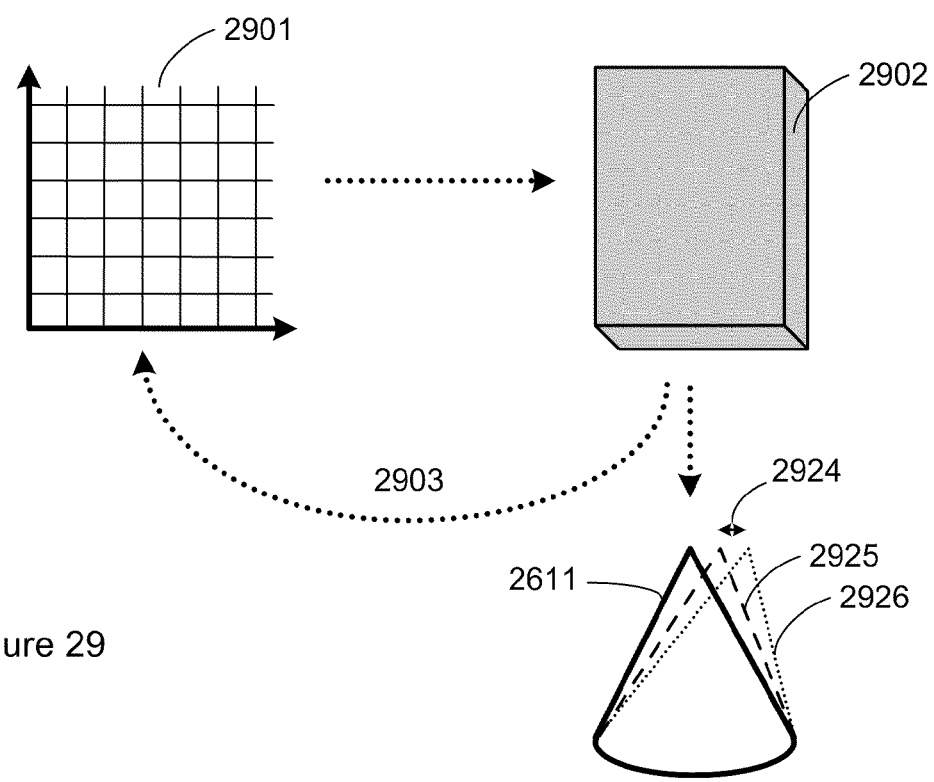

FIG. 29 depicts iterative refinement of an exposure map.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

In generation of some 2.5D structures by direct-write (laser) lithography, the resist may be much thicker than in ordinary 2D microlithography, such as lithography to produce semiconductor circuits and LCD or OLED displays. When the photoresist is thicker than the depth-of-focus of the writer tool, the spot size varies by depth (z-level) in the photoresist.

One problem with the prior process depicted in FIG. 1 is its sensitivity to disturbances. Slight variations in the dose, such as variations due to laser noise, and variations in the resist properties or the developer agitation, cause depth variations in the finished profile. Likewise, the time and temperature control during development is critical.

The multi-focal plane exposure method described in this disclosure is useful for compensating for the thickness of a thick resist layer and/or improving the fidelity of three-dimensional patterning. Multi-focus involves focusing at various depths in the resist, such as at the top, in the middle, and near the bottom, and assigning varying amounts of exposure dose to each of the focal planes.

A writer system for exposing at a single focal plane in a resist layer that is thicker than the depth of focus of the laser writing system may not meet the required fidelity for accurately forming parts of features in the relief map. Currently, there is a need in the industry for a more precise method for controlling depth and shape of features exposed deep down in a thick resist layer, preferably with an accuracy of +/−1%, so that better and more easily controlled 2.5D feature formation may result. Thus, when patterning smaller and more complicated three-dimensional features or parts of features buried in the resist, in particular microstructures or nanostructures buried deep down in the resist, exposing at a single focal plane and/or close to the surface to which the exposing energy is applied may not be sufficient to meet the fidelity requirements for 2.5D feature formation even if a high dynamic range pattern generator is being used.

The technology disclosed can be useful for creating a three-dimensional latent image with good depth and shape control in a thick resist by introducing multiple focus planes. The definition of a thick resist in this disclosure is that it is thicker than the depth of focus of the laser writing system being used for exposing the thick resist. The depth of focus, of course, depends on the numerical aperture of the writing system used. The selecting of multiple focal planes at which to focus exposing energy according to the present invention suggests that at least one of the focal planes is in a lower half of the thick resist layer, the lower half being the half that is further away from a surface to which exposing energy is applied, providing for a more accurate patterning of vertical or near vertical parts of features in the relief map. By positioning the multiple focal planes in an intelligent way, the present invention is enabling that parts of resist features buried within the resist, e.g. vertical corners or multiple vertical corners buried deep down in the resist, can be formed sharply. Other features disclosed include using pixels of different sizes in the multiple focal planes and focusing the pattern generator in the multiple writing planes in multiple writing passes. In a particular embodiment, the pattern generator supplies, in a single writing pass, multiple beams focused in the different focal planes, providing for a simultaneous writing of a plurality of focal planes in the resist.

Background on 2.5D Exposure

We disclose methods to generate three-dimensional microstructures, or nanostructures, using direct laser writing in a thick photoresist layer. Many of these surfaces are 2.5D or non-reentrant surfaces as defined above. One way previously described to manufacture such structures is to use a prefabricated photo-mask having a grey scale pattern, and expose the photoresist through that mask for a sufficient time to reach a sufficient exposure dose [mJ/cm2]. In direct writing using an optical pattern generator, on the other hand, the exposing dose may be a limiting factor. By superposition of N separate exposure passes, sufficient dose can be applied to create the desired latent image in the resist.

The N-pass writing is further utilized as a means for averaging out several different possible pattern-deteriorating effects labeled by the Japanese word Mura. Improved performance in all three dimensions (x, y, z) can be achieved by shifting the writing grid an appropriate distance in both the x- and y-directions. The exposure doses are set from resist depth-vs-dose characteristics, which take into consideration the non-linear depth-to-dose relationship, and absorption, bleaching and defocus properties in the photoresist.

Writing Systems

The writing system used is a direct-writing pattern generator, in contrast to systems that use masks as an intermediate step. The direct-writing system converts an input description of the 2.5D pattern, e.g., a list of (x,y,z) coordinates, to a bitmap and writes the bitmap, suitably converted to expose the resist. The writing system has a stage for holding the workpiece, a source of electromagnetic radiation in the range of 460 nm or less, e.g., a laser at approximately 413, 364, 355, or 266 nm wavelength. It includes focusing optics and a modulator for the radiation. Several architectures are possible: scanning one or several beams with an acoustooptic or mechanical scanner, scanning the stage under an array of projected light spots, scanning the stage in relation the image of a spatial light modulator, either projecting a 1D line or 2D area of contiguous modulated pixels, or an array of light spots individually modulated. What is more important than the actual mode of scanning or creation of the image is to have a high dynamic range and, preferably, a high maximum dose.

Suitable modulators include acoustooptic and electrooptic modulators and directly modulated lasers. micromechanical Spatial Light Modulators (SLMs) such as Grating Light Valves (GLVs from Silicon Light Machines) and Digital Mirror Devices (DMDs from Texas Instruments) as well as analog SLMs (from Micronic Laser Systems and Lucent) also may be suitable. Analog SLMs may rely on either tilting or piston driven mirrors. Either configuration may render shades of grey due to destructive interference effects.

Multi-Pass Writing

Binary modulators such as the DMD may achieve high-dynamic range greyscale modulation first by having 10,000:1 or better contrast, and secondly by writing many passes with different doses, e.g., with doses corresponding to powers of two. A pattern of 12-bit grey values may be written in 12 binary passes. It may be beneficial to use even more passes, such that the binary passes with highest dose are subdivided into multiple passes which build up the high dose gradually. If the total dose is higher than approximately two times the maximum dose that can be delivered in a pass, several passes at high dose can be used to accumulate the needed dose. Additional passes with less dosage may be used in a hybrid multi-pass scheme to get any dose value less than the maximum dose. For example, a six-bit grey value in the range 0-127 units might in this way be written in a writer capable of delivering maximum 16 units per pass, by combining in a hybrid multi-pass scheme a number of high-dose passes (here 7 passes) with a number of passes with lower dose (4 passes). Any dose in the range 1-127 units can thus be written in 11 binary passes with the doses 1+2+4+8+16+(16+16)+(16+16+16+16). This allows higher doses to be deposited in the resist than either the resist or the writing system is capable of in a single pass. Alternatively, binary writing passes may gain grey scale precision by using passes with less than a factor of two in difference, such as a factor of the square root of three: 1.0, 1.7, 3.0, 5.4, 9.0 units. A sequence with less than a factor of two grey scale differences may have more than one possible representation for a grey value; it is possible to choose the one which adds up closest to the actual grey value. In the sequence above, with a step of sqrt(3), the value 10 can be approximately represented as 1.0+9.0 or 1.7+3.0+5.4. During calibration, the dose sum that best represents the value 10, for instance, using the actual values in the multipass scheme can be chosen. The passes with less than a factor of two difference may be combined into a hybrid multi-pass scheme. For instance, passes of 1.0, 1.7, 3.0, 5.4 dose units plus ten passes with a 9.0 dose can span a range of 1-100 dose units, using a writer that delivers up to 9 dose units in a single pass.

Overview of Iterative Exposure Calculation, Absorption and Multiple Focal Planes Exposure with scanning laser light may be modeled as Gaussian beams with a Gaussian intensity distribution. Other optical power density distributions are naturally possible. The beam, or beams in a multi-beam writer, can be focused in the laser writer tool's final lens system either on the upper surface of the photoresist, or somewhere between the resist surface and the substrate surface in the downwards z-direction. During propagation through the photoresist layer, a Gaussian beam diverges (widens) due to its wave property, making the resulting lateral (x, y) as well as vertical (z) writing resolution deteriorate. The depth-of-focus is determined by the numerical aperture (NA) of the lens system of the writer system, together with the refractive index of the photoresist and of the ambient medium. Furthermore, the power density or deposited/absorbed exposure dose varies with the depth in the resist.

In generation of some 2.5D structures by direct-write (laser) lithography, the resist may be much thicker than in ordinary 2D microlithography, such as lithography to produce semiconductor circuits and LCD or OLED displays. When the photoresist is thicker than the depth-of-focus of the writer tool, the spot size varies by depth (z-level) in the photoresist.

The iterative modeling and dose selection part of this disclosure discloses methods of compensating for linear and non-linear response to exposing radiation of a relatively thick resist layer. When 2.5D patterning of thick resist is addressed, nonlinear effects become important.

Bleaching is one of the nonlinear effects. By bleaching, we mean a change in the optical absorption of a resist as it is exposed to radiation. This bleaching may result from absorption of energy and may also depend on the time between exposure passes or other phenomena.

A second kind of optical absorption does not expose the resist; it converts photons to heat. Dyes, pigments or nanoparticles in resist have this effect, as well as some of the chemical agents making up the resist. With non-bleachable absorption, the exposure dose required becomes exponential with depth.

Multi-focal plane exposure is a method of compensating for the thickness of a thick resist layer and/or improving the fidelity of three-dimensional patterning. Multi-focus involves focusing at various depths in the resist, such as at the top, in the middle, and near the bottom, and assigning varying amounts of exposure dose to each of the focal planes. For modestly thick resist layers, a single focal plane may be sufficient, positioned between the top and bottom of the resist layer. Often, a single focal plane in the bottom half of the resist, away from the exposed surface, will produce favorable results for reasons explained below.

The iterative modeling approach can readily take into account bleaching, dye and/or multi-focus exposure. Bleaching and dye can be taken into account when choosing how to apply multi-focus exposure, particularly as the top portion of the resist bleaches.

Iterative Analysis and Exposure after Modeling

Issues that can usefully be addressed when translating relief depths to exposure doses include asymmetrical response to the sweep direction of scanning writing laser beams, absorption of exposure doses, and photonic and chemical/physical processes in exposure and development.

One of the problems in 2.5D microlithography is asymmetry related to the scan direction of an exposing laser beam, i.e. sensitivity of exposure to whether the exposing energy is waxing or waning. In a raster-scan pattern generator, there is a difference between a first feature edge (change from no dose to high dose), and the second edge (change from high dose to no dose.) In the direction of scanning, and since the exposing beam spot has a finite width, the first encountered edge will receive a lower dose than the second edge. The second edge will absorb slightly less dose than the first edge, since it has already been partly bleached by the light exposing the previous position or pixel. This will create an effective tilt in the exposure. FIG. 5 depicts a simulated semi-sphere, after development, written using a laser scanning system and 20 μm thick resist. The scan is proceeding from left to right, so that left hand side of the semi-sphere is exposed first. The resist model used to simulate the dynamic system takes into account bleaching of the resist. The semi-sphere is the ideal, desired shape of the resist after development and, therefore, the desired shape of the latent image after exposure and before development. As the simulation shows, a pattern of exposing radiation that matches the ideal pattern produces a latent image that is skewed to the left. This is readily apparent in the difference graph in the middle of FIG. 5, which shows that the difference is asymmetrical between the left and right edges of the feature.

A dynamic model of 2.5D latent image formation can take into account at least three exposure-energy-absorbing processes. First, $\alpha_{Exp}$ non-bleaching absorption leading to developable exposures, ordinarily created by the concentration of the Photo-Active Compound (PAC). Second, $\alpha_{Exp, Bleach}$ leading to developable exposures with a component that is so-called bleachable, that has an absorption that diminishes with increasing absorbed exposure dose. This can be mathematically expressed as a linear approximation using two derivatives:

$$\frac{\partial \alpha_{Exp}}{\partial z} \text{ or } \frac{\partial \alpha_{Exp}}{\partial D}$$

where D is the exposure dose. Thus, one may express the change of the bleachable absorption as:

$$\alpha_{Exp}(z) \approx \alpha_0(z=0) + d \cdot \frac{\partial \alpha_{Exp}}{\partial z}$$

$$\alpha_{Exp}(D) \approx \alpha_0(D=0) + d \cdot \frac{\partial \alpha_{Exp}}{\partial D}$$

A third energy absorption component, represented by $\alpha_{Dye}$ converts absorbed photon energy to heat, rather than resist development. A dye or another photon absorbing substance in the resist has this effect.

The response to the exposing light/radiation in the photoresist may be separated generally into photonic and chemical/physical effects. The photonic effects, include an inherent proximity effect caused by the convergence and divergence of the focused light in the photoresist, light scattering in the optical system, light scattering in the photoresist, reflections at the substrate etc. The chemical/physical effects include the influence from the soft-bake of the resist, the dehydration and rehydration of the resist, the photo-chemical reactions during the exposure, the physical-chemical diffusion processes during and after the exposure, and the concentration-, temperature- and agitation-influences during the development.

Examples of Iterative Adjustment of Exposure

FIG. 6 depicts improved faithfulness of the latent image to the ideal, after 5 iterations of simulation and exposure adjustment. The ideal and exposed patterns are virtually indistinguishable in the top part of the figure, which is significant improvement over the results depicted in FIG. 5. The scale of the difference graph in FIG. 6 is adjusted from the scale in FIG. 5, because the difference is small. As the bottom part of FIG. 6 shows, the exposure pattern is not a semi-sphere after adjustment, but the exposed result in a latent image or after development closely approximates the ideal.

FIGS. 7-8 depict uncorrected and corrected exposure to produce a latent image with one box set on top of another. FIG. 7 shows the result of applying an exposure that matches desired result. The exposing radiation profile is shown at the bottom. The exposed result is compared to the ideal at the top. The middle part of FIG. 7 shows the difference in the exposed pattern, between ideal and actual.

FIG. 8 depicts the improved exposure pattern and result after 10 iterations of modeling and exposure pattern adjustment. The proximity effects related to exposing a thick photo resist with a complex pattern are corrected by iterative modeling and exposure adjustment.

FIGS. 9-10 depict uncorrected and corrected exposure to produce a latent image of three rounded features in a row. FIG. 9 shows the result of applying an exposure that matches desired result. The exposing radiation profile is shown at the bottom. The exposed result is compared to the ideal at the top. The middle part of FIG. 9 shows the difference in the exposed pattern, between ideal and actual.

FIG. 10 depicts the improved exposure pattern and resulting latent image after 10 iterations of modeling and exposure pattern adjustment. In the top image of FIG. 10, the ideal and exposed patterns are virtually the proximity effects related to exposing a thick photo resist with a complex pattern corrected by iterative modeling and exposure adjustment.

In some circumstances, the exposure pattern is tentatively corrected before the latent image is simulated. The algorithm provides rules and/or a model of the exposure/development process. The result of this tentatively corrected pattern is simulated and fed into an iterative correction process. The iterative process can be repeated until the residual improvement is below a pre-determined threshold.

The aforementioned algorithm is used to compensate for non-linear photo resist processes such as bleaching. Accordingly, the algorithm removes the extra proximity effects that occur for thick resist and a high optical NA.

In other circumstances, the algorithm calculates the non-linear effect in some directions in the XY plane and then calculates the total correction as a linear combination of the result. The algorithm may calculate the non-linear effect in one or a few directions in the XY plane only and then calculate the total correction as a linear combination of the result.

Impact of Etch Rate and Minimum Line Width Requirements

FIG. 11 illustrates use of a reduced etch rate to improve so-called feature size, lateral dimension, or line width variation, which is also sometimes referred to by the shorthand "CD" variation, for feature critical dimension variation or accuracy. Changes in etch rate impact the minimum line widths typically achieved. This is interrelated to the feature area and gradient field in a pattern. The etch rate for a deep reactive ion etch (DRIE) process is often treated as dependent on the minimum line widths or feature sizes and the gradient field in the area etched. The dissolution or removal rate for some thick photoresists is a function of the minimum line widths or feature sizes and the gradient field, as shown in FIG. 6. Depending on the etch rate selected, the etching in a DRIE process applied to thick photoresists will give different z-depths for patterns with different feature precision requirements, feature areas and gradient fields, even if the patterns have the same z-depth in the CAD-pattern.

FIG. 12 illustrates collecting data regarding the effect of etch rate as function of feature CD. The relationship between the etch rate (or dissolution rate) and the feature precision requirement, feature area and gradient field is first identified, before compensation is applied. From this data, a rule-based (or model-based) compensation model is created that adjusts the grey-scale as a function of feature precision requirement, feature area and gradient field. The feature precision requirement and/or similar measurements such as the feature area and/or gradient field are then calculated. Thus, from the function identified above, changes are made in height information for the pattern. This may be done either mathematically or in grey scale. After the adjustment is made, each pattern will get the correct depth independently of the feature CD. Finally, the modified pattern is written.

The proximity effect is caused by the convergence and divergence of the focused light. By exposing areas that are large compared to the proximity effect, and by measuring the depths in the central regions of such exposed areas for a certain combination of spot size and grid size, the proximity effect influence is measured and can be compensated. The resulting depth-vs-dose characteristics for the photoresist are then more or less dominated by the photo-chemical effects. The proximity effect-related processes are handled by proximity effect correction and compensation methods.

FIG. 13 illustrates compensation based on the data collection illustrated by FIG. 12 and result of this compensation. It illustrates adjusting the exposure dose to change the z-dynamics of the exposed pattern. Exposure of a (positive) photoresist may or may not encounter a bleachable PAC. In the development of a positive photoresist, each dose level is dissolved (etched) with a rate that is a function of, and increases with, the dose. In timed, rate-dependent processes, control of the etch depth d=d(D) requires careful control of development time $T_{Dev}$. Erroneous $T_{Dev}$ results in erroneous relief depth d and erroneous relief swing Δd. The dissolution rates are also affected by the developer concentration, the developer temperature, the development agitation by flushing, stirring etc., which helps maintain fresh developer at the resist surface and avoid accumulation of diffusion barrier of dissolved resist in the developer. Given these factors, it is useful for control of relief depths to depend primarily on controlling the exposure dose.

We disclose an alternative for depth control of 2.5D reliefs that involves an end point approach to developing resist. In a high-absorption photoresist that is fully developed until the etch rates have decreased at least close to zero, the depths are relatively insensitive to the (i) development time, (ii) developer concentration, (iii) developer temperature, or (iv) development agitation by flushing, stirring, etc. Instead, the depths depend most heavily on the exposure dose and its precision.

Introduction to Bleaching and Multiple Absorption Processes

Iterative compensation can be applied to a variety of process factors, beyond exposure dose.

For some purposes, a resist with high absorption $\alpha_{Exp}$ is useful. The high absorption $\alpha_{Exp}$ resist may be bleachable. For simplicity, the result of exposure may be described as a "tube" of constant width through the resist, with due to the higher absorption fast decaying dose with depth. FIG. 16 illustrates a "tube" of exposed resist. At a certain depth, different for different doses, the exposing number [$cm^{-3}$] of photons has decreased to a level where the development dissolution rate approaches zero. Development means that every dose level is dissolved with a both in time, and thus for different resulting depths, varying dissolution rate. In resist thicker than the exposed depth, the dissolution rate decreases with increasing depth and approaches zero. Full development involves development time that allows the dissolution rate to go close to zero for the deepest relief levels, where the highest exposure dose was applied to decrease the greatest feature depth. With extended development, the control of the final resist depths for different doses is governed and controlled by the exposure dose (due to the high absorption) and not the development time. The exact exposure dose is controlled in the exposure tool.

In other circumstances, a resist with at least two absorption processes is used. The first absorption process described by the coefficient $\alpha_{Exp}$ or $\alpha_{Exp, Bleach}$ results exposure of the resist and formation of the latent image, with bleaching of a first absorbing component. The second absorption process, $\alpha_{Dye}$, increases absorption, but does not contribute to the exposure of the resist. That can be achieved using dyed or colored or pigmented resist additives.

The control of the final resist depths for different doses can be governed and controlled by the exposure dose due to the high absorption, with reduced sensitivity to development time and conditions. An advantage of using the exposure dose is that the photon absorption and depletion is not controlled by the same absorption process responsible for the exposure, a process which is also bleachable.

The second absorption process $\alpha_{Dye}$ must be balanced against the available photon flux, i.e. the maximum available exposure dose, the exposure absorptions $\alpha_{Exp}$ or $\alpha_{Exp, Bleach}$, the desired maximum relief depth and the desired relief swing.

If the combined absorption coefficients are too high, then the desired relief depth cannot be reached at full development, because the available does at depth is too small. If the total absorption results are too low then the dissolution rate(s) and the final relief depths will be controlled by the development time, which is undesired. A useful combination of absorption coefficients can be obtained by chemical tailoring of the various absorption processes to available number of photons and the relief to be fabricated.

The various absorption processes can be combined in many ways including:

(i) $\alpha_{Exp}$ or $\alpha_{Exp, Bleach}$ low, and $\alpha_{Dye}$ high.
(ii) $\alpha_{Exp}$ or $\alpha_{Exp, Bleach}$ high, and $\alpha_{Dye}$ low.

Both alternatives may result in a high total absorption. The second alternative should lead to reduced requirement on available photons, which is useful when available exposure dose is a limiting factor. The absorption level becomes high and the dose is limiting when the resist thickness is increased.

Refractive Index and Depth of Focus

Exposure of a thick resist is difficult when the film thickness is substantially larger than the depth-of-focus of the focus system of the exposure tool. For example, if the laser light is focused at the upper surface of the photoresist, the laser light or beam will—after the focus—start to diverge, to widen. Deeper resist regions will be exposed by a wider light beam that shallower regions. Due to Snell's law of refraction and the fact that photoresist has a higher refractive index $n_R$ that an ordinary gas ambient such as air or nitrogen, the depth-of-focus in the resist will be larger than in the atmosphere. Accordingly, it is useful for a resist to have as high $n_R$ as possible. A second target is to adapt the bleaching properties of the photoresist, which depends on the exposure dose, so that the refractive index of the resist does not change too rapidly or too slowly with the absorbed exposure dose and consequent bleaching. The appropriate characteristics of a particular resist can be determined by exposing areas of constant dose, with widths bigger than the proximity effect effective distance, and by accurately measuring the depths after development for the various doses. This yields depth-vs-dose characteristics of the resist, which may be expressed as d=d (D). The characteristics may include all non-linear effects as well as bleaching.

Particular Use Cases

By carefully choosing parameters for the exposable absorption processes $\alpha_{Exp}$ and the non-exposable processes $\alpha_{Thermal}$, and $\alpha_{Exp, Bleach}$, the resulting process may be tuned and the performance of the 2.5D-relief generating tool will be greatly improved.

In some circumstances, the photo-sensitive material is given a high exposure-active absorption via the PAC. The development process may be "terminated" at a certain depth level where all the exposing energy has been depleted. This requires that the amount of exposing energy is not a limiting factor.

According to yet another embodiment, when the amount of exposing energy is not a limiting factor, the photo-sensitive material is exposed to a pre-determined absorbed dose. The photo-sensitive material is then developed until the development process ceases at a certain depth in the photo-sensitive material where there no longer is any exposure energy available due to the exposable absorption.

High Gamma Resist with Bleachable and Passive Absorption Components

The technology described in this disclosure provides methods to control a three-dimensional photoresist process better than those known in the art.

FIG. 2 shows the dissolution properties of two fictitious but typical resists used for microlithography (Resist A) and three-dimensional processing (Resist B). Resist A and its process conditions are chosen to give a high gamma and Resist B a low gamma. Gamma γ is a measure of how fast the dissolution rate changes for a small change of exposure dose, i.e.

$$\gamma = (dR/R)/(dE/E)$$

where R is the dissolution rate as expressed by nm/s and E is the exposure dose as expressed in mJ/cm$^2$. Gamma is a unit-less number and does not depend on the units chosen to express R and E. There exist several definitions of gamma, each determined by a different type of measurement. In Mack C., Fundamentals Principles of optical Lithography, Wiley (2007) the author describes in chapter 7.2 what he calls "measured contrast" or $\gamma_m$, determined from the remaining thickness after development as a function of dose:

$$\gamma_m = \frac{1}{D} * \frac{dz}{d(\ln E)}\bigg|_{E=E_0} \quad \text{(Mack 7.21)}$$

where D is the full thickness, z the remaining thickness, and E the exposure dose and $E_0$ the dose where the resist justs clears (all resist is removed in the developer). Another measure is the theoretical contrast $\gamma_{th}$, based on dissolution rate instead of thickness:

$$\gamma_{th} = \frac{d(\ln R)}{d(\ln E)} \quad \text{(Mack 7.22)}$$

where R is the dissolution rate in the developer. We adopt this equation as the gamma definition used in this disclosure, i.e. a resist specified to have a gamma of 5 or higher in this disclosure has—in the terminology of Mack—a theoretical contrast of 5 or higher. It can be determined by measuring how deep the developer has dissolved the resist in areas with known exposure after a fixed period of time. Mack says that if the development rate varies with the depth into the resist, the measured contrast fails to give a good value for the theoretical contrast. He gives two examples, namely the cases of surface inhibition and of absorbing resist. In the case of passively) absorbing (non-bleaching resist Mack gives a relation:

$$\gamma_m = \gamma_{th}\left(\frac{1-e^{-\alpha nD}}{\alpha nD}\right) \quad \text{(Mack 7.29)}$$

Mack goes on to propose what he calls "practical contrast" denoted by γ without any subscript. Practical contrast is based on the how long it takes for the developer to remove the resist after it has been exposed to varying doses. The theoretical contrast, which is the quantity used in this disclosure, depends on the detailed chemistry during dissolution of the resist in the developer.

Photoresists for binary processing, such as those used in microlithography, are tuned to have a high gamma, i.e. a theoretically gamma of 5, 8, 12, or even 20. These resists do not work well for three-dimensional processing, as shown in FIG. 1. FIG. 2a shows a diagram of the dissolution rate versus dose for two different resist-developer systems. Resist A in FIG. 2 has gamma=8, which means that for low doses it has low dissolution rate, and above a threshold dose the dissolution rate rises very rapidly. If the resist is developed for a predetermined time, the thickness loss will be proportional to the dissolution rate and the time, assuming that the dose is uniform in the vertical direction. Typically, the development times are fairly long so that the resist has essentially stopped dissolving any resist at the end of development, sometimes called an endpoint. FIG. 2b shows a diagram of the remaining resist thickness after development of the two resist systems in FIG. 2a.

The remaining resist thickness in FIG. 2b is then a steep function of the dose. FIG. 2c shows the change in thickness vs. change in relative dose, i.e. $(dD/(D_{max}-D_{min}))/(dE/E)$, and it is seen that with Resist A the remaining thickness, i.e. the profile depth after development, is very sensitive to dose and a 3% percent variation in dose or sensitivity would give high variation in the thickness, since there is an sensitivity that essentially diverges.

When making the three-dimensional patterns, the dissolution typically is timed and not allowed to continue indefinitely. Therefore, the profile depth is proportional to the development time, i.e.

$(dD/D)/(dt/t)=1$ where D is the depth and t is the development time. This process is called a dissolution-limited process. The process is furthermore sensitive to the temperature, e.g. the activity of the developer may double for every 7 degrees and this is magnified by the steepness of the dissolution curve.

When making three-dimensional patterns with Resist A all the depth change occurs at a very small dose range, e.g. only between 60-80% in the diagram. With a modulator controlled by a DAC with typically 8 bits, only a small range of the 256 codes would be used to control exposure dose. Obviously, the process described above using a Resist A type resist as the only resist is not well-suited for creating three-dimensional patterns.

Resist B in FIG. 2 is a resist that those of ordinary skill would expect to be used for three-dimensional processing. It has a gamma of 2, which means that the dissolution curve in FIG. 2a is less steep. The development time is also typically less. The remaining resist thickness is also less steep. The dynamic range is larger, practically 20% to 100% for the maximal dose might be used, since the top surface of the profile is preferably placed some distance from the top of the resist due to the in-homogeneity of the resist close to the surface caused by e.g. drying, chemical segregation, etc. FIG. 2c shows the dose sensitivity of the resists in FIG. 2a.

There will be a larger range of dose values used to create the depth range and a 3% dose variation changes the remaining thickness by at most 3% as shown in FIG. 2c. The sensitivity to relative time changes is equal to Resist A but the sensitivity to temperature is less inflated than for Resist A. Overall, Resist B and the process described are more suitable for creating 2.5D patterns, but still not stable and robust enough to create patterns with depth accuracy requirements of 1% or less. Again, the Resist B process described requires frequent recalibrations and critical process tuning.

Process Dominated by Bleachable Absorption

FIG. 3a shows a diagram of the remaining resist thickness after development of a resist dominated by bleaching. FIG. 3a shows a first process in which the remaining thickness for Resist C is dominated by bleaching, which we call a bleaching-limited process. Many common resists, in particular DNQ-type positive resists, have an absorption rate of 0.5 per micron or more. When the light exposes the resist, a hydrophobic group is photochemically converted to a hydrophilic acid, allowing the water-based developer access into the resist. The photoconverted group has much less absorption after the conversion than before it. The absorption bleaches strongly during exposure and is much reduced. This is commonly described by so called Dill parameters which go into a system of rate equations formulated by Rick Dill at IBM in 1975. See, F. H. Dill, et al., "Characterization of positive photoresist," IEEE Transactions on Electronic Devices, ED-22, 445-452. Dill parameters, exposure and development of photoresist are discussed in many textbooks on lithography; a recent text is C. Mack, Fundamental Principles of Optical Lithography, Wiley, 2007. Optical absorption of various resists is described in the article, "Photoresists Optical Paramaters," supra, which indicates refractive indexes of 1.65-1.710, depending on wavelength for a number of DNQ resists. Another article on the same site, "Exposure Phtoresist," indicates sensitivity of various resists up to 460 nm.

In a thick resist, which is essentially non-transparent before the exposure, the exposing dose initially reaches only into the first micron or so at the top. After the top layer has been bleached, the light reaches the layer below it and bleaches it. In this way the light works its way into the resist. Since the energy to bleach one micron of resist is the same regardless of the position in the resist, the depth to which the resist is exposed and bleached is a linear function of the dose. At development the resist will develop as far as it is exposed, and the remaining thickness is a linear function of the dose. The thickness change vs. the relative dose change has a different curve and is generally more benign. As indicated in FIG. 3a, the dose to bleach the resist is considerably higher than what is needed to expose the resist without bleaching. FIG. 3a shows an example where the resist is exposed from top-to-bottom at the dose 1000%, as compared to a 100% dose for a non-bleaching and non-absorbing resist. FIG. 3 shows an idealised resist, the actual values may differ in an actual process.

The process in FIG. 3a is suitably applied to a high-gamma resist, such as Resist A in FIG. 2, with a long development time. The development will then develop through the exposed and bleached part of the resist and stop at a certain dose, which has a very low dissolution rate. The timing and activity of the developer will have less influence on the remaining depth and the control of the profiles will be better due to the more linear depth vs. exposure curve. The result is a process which is more robust and easier to use in an industrial setting.

Process Dominated by Passive Absorption

FIG. 4 shows a second process with Resist D, which is dominated by a non-bleaching absorption, which we call an absorption-limited process. Like Resist C, Resist D has high gamma and long development, so the development reaches a point that is little influenced by time and temperature during development. If the absorption is expressed by $\alpha$ (with the unit per micron), the exposure at the depth D is $E(D)=E_0\exp(-\alpha D)$ where $E_0$ is the exposure at the surface.

The relation can be inverted to give the depth where the exposure is at the threshold dose $E_{th}$ where with the actual development time the developer effectively stops $D(E_{th})=1/\alpha * \ln(E_0/E_{th})$ or, simplified, $D=c_i \ln(E)+c_2$ where $c_1$ and $c_2$ are constants which implicitly represent $\alpha$, the resist sensitivity and the development time.

FIG. 4a shows a diagram of the remaining resist thickness after development of a resist dominated by absorption. FIG. 4b shows the dose sensitivity of the resists in FIG. 4a.

FIG. 4b depicts the so-called absorption-limited process. The dose sensitivity is much less than either the dissolution-limited or the bleaching-limited process. The amount by which dose sensitivity is suppressed depends on the relation between the profile depth $D_{max}$ and the absorption α. The greater the value of α is, the less sensitive the process is to relative dose and developer disturbances and the better the process control is. However, the exposure dose needed is higher. A significantly high value of α will require such strong exposure that the resist may solarise. That is, the resist may reverse its sensitivity and start getting more difficult to dissolve again, at the top. Likewise, if the energy is deposited in a brief time, such as using a laser pulse, the maximum dose may be limited by the allowable heating. Therefore, it is desirable to have a range of resist formulations with different α for different profile depths or resist layer thicknesses. For a maximum profile depth of $D_{max}$ may in different contexts have a value higher than 1.5/Dmax, 2/Dmax, 3/Dmax, 4/Dmax, or 5/Dmax, corresponding to a maximum writing dose of 4.5, 7.4, 20, 55, or 148 times higher than the dose that expose the top portion of the profile. Obviously every writing system also has some practical, thermal or throughput-related limit to the highest dose $E_{max}$ which puts an upper limit $α_{max}$ on the absorption such as 1000, 300, 100, 30, or 10 times the dose used to expose the top of the profile $E_{min}$. The value of $α_{max}$ can be calculated as $\ln(E_{max}/E_{min})/D_{max}$. If $D_{max}$ is one micron then α will have to be smaller than 6.9, 5.7, 4.6, 3.4, or 2.3 per micron. In a different example, the Fresnel lens above where $D_{max}$ is 5 microns, α may be need to be smaller than 1.38, 1.14, 0.92, 0.68, or 0.46 per micron.

The absorption should preferably be matched to the resist thickness and the dynamic range of the writing system. One way of doing this is by the selection of existing resists, e.g., dyed or colored resists. Another way is by adapting the writing wavelength to specific profile heights and resists. A third approach is to add a passive or bleachable absorbing compound to the resist formulation.

The scales are different in FIGS. 2b, 3a, and 4a, in order to highlight the basic function of each resist and process. A real resist and resist process will have both absorption and bleaching. The depth of development will be affected by the finite dissolution rate. The dissolution rate alone gives a depth increasing faster than proportional to the exposure dose. A so-called bleaching resist will have a linear relation between depth and dose. A so-called absorbing resist will have a depth function that grows slower than proportional with the dose. The more that the absorption dominates, the more the depth vs. dose will resemble a logarithmic curve. Piecewise, we may express the depth as proportional to the dose raised to a constant k.

$$D(E) = k_1 E^k$$

where $k_1$ is a proportionality constant. One way to classify the resist processes is to name them according to the value of k:
  Dissolution-like: k>1.5
  Bleaching-like: 0.5<k<1.5
  Absorption-like. k<0.5
Fresnel Lens Example An example is that of the making of a Fresnel lens. The profile depth is 5 microns and the required wavefront error is lambda/4 peak-to-valley at 400 nm, i.e. +/−50 nm or +/−1% of the profile depth. Assume we need to write the Fresnel lens pattern with a profile depth of 5 microns. The depth inaccuracy needs to be +/−50 nm or +/−1% of the full depth. If the limit on dose $E_{max}$ is 100 times $E_{min}$ α can be up to 0.92 per micron. We can directly use the diagram in FIG. 4a for Emax/Emin=100 and find that the dose sensitivity is 0.22% of the full depth per % relative dose change. The allowed dose variation is then 1/0.22=5%, This is well better than the writing and development system's 3% control and we can actually select a resist that has a lower α, e.g. α=0.64 per micron or we can use α=0.92 per micron and produce surfaces with three times better depth control, e.g. <+/−0.15% or 0.08λ peak-valley.

If we stay with α=0.92 per micron then we need 100 times higher dose than the dose at the threshold as shown in FIG. 4. The relative dose accuracy at the least dose need to be 5% i.e. the background noise in the image has to be less than 1/100*5%=0.0005 of the highest dose. Therefore we need a writing system with a signal to noise of 2000:1. (The noise may come from internal reflections, non-perfect extinction in the modulator, stray light, and inaccurate dose. Above all the writing system needs to have high contrast so the presence of the maximum dose in an area does not contaminate the clean exposure of the lowest one. The grey-value bitmap representing the dose needs to have at least as much dynamic range as the writing system, and in the examples above a 12-bit representation may be suitable, corresponding to a signal to noise of 4096:1, or in a different preferred embodiment of the present disclosure at least 10 bits or 1024:1. Previously known optical writers have 8-bit representations of the bitmap in optical writers and a signal to noise typically below 256:1.

The example discussed above shows that the useable α depends of the profile depth and in order to write a variety of different profile depth it is useful to have a selection of resists with different α. All resists have some level of absorption, and resists with added dyes to make them more absorbing are known in the art, e.g. as a means to avoid reflecting notching on metal layers with topology. According to preferred embodiments of the present disclosure, the absorption in the resist used for producing three-dimensional patterns on a workpiece can be made higher by addition of a dye or pigment, e.g. soot. Red, green, blue, and black resists made for LCD color filters can be used as a selection of resists with different absorption coefficients at the writing wavelength.
Use of Multiple Focal Depths and Numerical Apertures Another way to enhance the precision of latent image formation is to expose the resist in N different passes with more than one focus settings in the z-direction. Different focal plane positions from the top of the resist through the resist layer can be applied to different exposure passes. By defining M different focus settings, the negative effects of the Gaussian-beam divergence can be reduced. Each of the relief depths within one layer will then be exposed with approximately the same Effective Spot Size. This is useful to improve the resolution both in the lateral x-y-direction and in the vertical z-direction.

FIG. 14 illustrates M=3 different focal planes. The N=3 separate, superimposed exposures are exposed with M=3 different focus settings. A positive photoresist is assumed.
Pixel Sizes can Vary FIG. 15 adds to FIG. 14 a representation of varying pixel sizes in different exposure phases. Each of the focal planes 1511, 1512, 1513 has been given an individual grid size. A finer grid size 1513 is applied where the relief features 1533 are sharpest. A fictive relief, with a sharper tip deeper in the photoresist, is shown as a hatched line 1533. A positive photoresist is assumed. The of exposing 1521, 1532, 1534. There are a multitude of different possible methods to set the different focal planes, and to match those to the desired exposure doses at all the certain depths, for all the N exposures, in the resist. Examples of possible exposure patterns embodiments are given below.

Selecting a Single Focal Plane

One approach is to use a simple linear interpolation between the N layers. Following this approach, layers which in turn may contain several exposure doses which will reach different depths in the resist after development (assuming a positive photoresist), may be assumed to be exposed with an "average focus".

One approach is to solve for an unknown focus vector:

$$\min \iint_{x,y} (E(x, y, F, N) - I(x, y))^2 dx dy$$

where E is the 2.5D surface after exposure, I is the ideal 2.5D surface that is the pattern, F is an vector with different focuses and N is a vector with fixed different parameters that affect the exposure, for example resist parameters, development time etc.

There are several ways to solve this equation above using commercial software. One method is the Newton-Raphsons method; more generally, methods of non-linear optimization can be applied. Recall from above that the function E can be calculated as function of F. As a relatively crude approximation, the E can be calculated using a convolution between the object and some function that described the optical system (including or not including the development process). This method of calculating E is relatively fast and can be used for large patterns. Better, if the pattern repeats or if resources permit, one or more unit cell could be rigorously simulated using either commercial available or specially developed software that simulates the exposure. For instance, a full propagation model and a complex chemical model for the development and process and circular boundary conditions could be applied.

When solving the equation above, one can effectively start with one focus layer, derive a result, then repeat the process adding more focal planes one at a time until the merit function does not improve more than a certain limit. The maximum amount of focal planes can be set before the analysis begins or could be selected based on results of the analysis.

Another approach is to approximate the exposure process of each of the N exposures with a mathematical convolution of the exposing doses For instance, once can apply a Gaussian "kernel" and an "average focus" within each of the N exposures, for each of the depths that will be reached in the resist after the development. Perform the calculations of the N different 2-D convolutions, with the applicable Gaussian width and peak value. Alter the outcome after comparison to the original relief, and once again perform the N 2-D convolutions. Iterate until the process converges.

Another approximation of the multi-focal exposures can be obtained by applying 3-dimensional convolution to calculate the exposure doses of each of the N individual exposures. That can be made by either approximating the 3-dimensional convolution in the z-direction by discrete summations of the contributions from the N discrete exposures, or performing a 3-dimensional convolution using Volume pixel elements, or Voxels, throughout the entire volume of the photo-sensitive material.

Multiple Focal Planes

When using high resolution optics in combination with a thick resist you will face the problem that the spot radius will vary through the resist. This will affect the resolution and you will get different resolution at different Z-positions in the resist.

To improve fidelity over the full depth of the profile, use can be made of a flexible, or adaptive, definition of (the N dose-boosting layers, and) the M focus layers by a first analysis of where the strongest gradients $\partial z/\partial x$ and $\partial z/\partial y$ are located in both the x- and y-directions, and—more important—in the z-direction. That may be done in a preparation software processing system. For relief "pattern" details that have sharp z-direction details that produce high spatial frequencies at deep levels in the photo-sensitive material, the corresponding focal planes where those relief details appear should be positioned deep in the material, preferably as deep as possible. For relief "pattern" details which have sharp z-direction details that produce high spatial frequencies at shallow levels in the photo-sensitive material, the corresponding focal planes for those relief details should be positioned shallow in the material, or even at the resist surface. For relief "pattern" details that have sharp z-direction details at intermediate levels in the photo-sensitive material, the corresponding focal planes for those relief details should be positioned at intermediate depths. In all cases, the depth positioning of relief levels within the different focal planes is arranged by the exposure dose. In practice, this means that the dose used to define the pattern is assigned to one of the focal planes Think of a pyramid with a sharp tip and a sharp angle where the sides meet the ground or floor. The area around the tip is exposed in a writing pass with focus near the tip, and the lower parts of the sides are exposed in a pass with focus near the ground. Each pass is described by a bitmap, and the low-focus bitmap contains only zeros around the tip, so that the bitmap in the high-focus bitmap determine the shape of the tip. For xy coordinates corresponding to the lower parts of the sides, the high-focus contains zeros or small values and the surface shape is determined by the data in the low-focus bitmap. In intermediate areas both bitmaps have non-zero data and the exposure dose is divided between the two passes.

If the pyramid is low compared to the focal depth, one pass with a single focus setting may be enough. If, on the other hand, the pyramid is high compared to the depth of focus two passes may not be enough to define details on all levels, and more passes and focus levels may be used. The dose at a specific xy point is then assigned to one or more passes which give the best 3D fidelity to the data. To determine the number of passes needed and how to assign the doses to the layers, i.e. to determine the layer bitmaps, in the presence of complex patterns, absorption, bleaching, defocus and developer kinetics is a non-trivial task. We disclose for this purpose software algorithms and hardware to do this automatically.

In other circumstances, the dose setting of the N exposures can be incorporated into the non-linear exposure characteristics of the photo-sensitive material, which in a 3-D application is shown by its depth-vs-dose function. One of the root causes to the non-linearity of the photoresist depth-vs-dose response is the so-called bleaching that results from depletion of the photo-active compound (PAC) during the absorption of the exposing radiation/electromagnetic radiation/light/laser light. Compensating for non-linear effects and bleaching effects is useful when setting doses in an N-exposure writing scheme.

Impact of Thickness on Divergence

FIGS. 16 and 17A depict beam divergence patterns in resist layers that are 1 and 80 µm thick, respectively. FIG. 17B is an enlargement of a section of the 80 µm thick resist, which shows a section 5 µm thick and makes it easier to visualized convergence and divergence pattern in the thick resist. In FIGS. 16-17, the vertical axis is scaled to match the resist thickness. Accordingly, the axises have much different scaling factors. In each figure, the focal plan is set to the middle of the resist layer. For the 1 μm thick resist in FIG. 16, exposure is in a tight column, with relatively little divergence. For the 80 μm thick resist, FIG. 17B is provided to improve comprehension of the convergence and divergence pattern in the 80 μm thick resist. From this enlarged simulation result, one can see a so-called waist in the focus that extends about +/−300-400 nm on either side of the "0" position focal plane. Within about +/−1.5 μm of the focal plane for the 80 μm thick resist, the beam is workably narrow. The reported numerical aperture of 0.55. In air, this would correspond to a half-angle of about 33 degrees or a focal cone of about 67 degrees. The resist is specified as having an $X^2$ response. The refractive index is not given in the figures, but may have been about 1.5, which is less than 1.7, which is a reasonable target value. Divergence produces rounding of some features in a latent image.

A usefully precise measure of beam divergence and, therefore, of depth of focus is the so-called Rayleigh range. Applying the Rayleigh range $z_R$ as the criteria for the depth of focus, the Rayleigh range extends a distance on either side of the focal plane for which the beam cross-section is not larger than square root of two times the diameter of the beam cross-section at the best focal plane. We use two times the Rayleigh range distance as the depth of focus, as further explained below.

The depth of focus can be defined in many ways. In practice, the usable depth of focus is often determined empirically as the largest focus latitude that is compatible with acceptable yield. This practical approach depends on the design, performance specifications and economic value of the structures produced.

For patent purposes and in this disclosure, we use the following definition of the depth of focus DOF, as twice the Rayleigh range $z_R$ for a beam which is Gaussian or approximately Gaussian. Mathematically, $$DOF = 2z_R = 2\pi w_0^2/\lambda = 2\lambda/(\pi NA^2)$$

where $w_0$ is the $1/e^2$ beam radius at the beam waist. It is related to NA through $$w_0 = 2\lambda/(\pi\Theta) = \lambda/(\pi NA)$$

where NA is $\sin(\Theta/2)$ and $\Theta/2$ is the angle from the center line of a diverging beam where the intensity has fallen to $1/e^2$ of the value at the center. $\lambda$ is the wavelength in the medium, in this case, the wavelength in the resist, which typically has a refractive index of about 1.7 for UV wavelengths. The formula uses the paraxial approximation where $\sin(\Theta/2) = \Theta/2$. For some optical systems, in particular image-projection systems using partially coherent illumination, the definition $DOF = \lambda/NA^2$ applies to fairly approximate the depth of focus. The difference between $DOF = 2\lambda/(\pi NA^2)$ for a Gaussian beam and $\lambda/NA^2$ for an imaging system comes partly from the different physics, partly from the top hat vs. Gaussian filling of the NA with light.

For some purposes, it is useful to define thin and thick resist using this Rayleigh range definition of depth of focus. We define thin resist to have a vertical thickness of less than or equal to one or two times the depth of focus. Thick resist has a vertical thickness of greater than or equal to either four or five times the depth of focus. In thin resist, convergence and divergence effects are relatively moderate. In thick resist, convergence and divergence effects should, in the view of these inventors, be taken into account explicitly. Either four or five times the depth of focus can be chosen as a practical definition of when a resist is considered thick for purposes of this disclosure. We will use these definitions of thin and thick resist throughout this disclosure.

Impact of Focal Plane Choice on Pattern

FIG. 18 shows the difference between ideal and exposed in a 20 μm resist layer, when the focal plane is set at 10 μm. The ideal feature has vertical sides, like a semi-sphere. The resulting exposure has an inflection point at about the focal plane, witching from a convex solid to a converse solid. The differences graph of FIG. 18 dramatically illustrates the formation of fillets where the feature sides are supposed to be vertical.

The conventional patterns for lithography in 2D do not translate well to 2.5D because 2D patterns are usually binary: the resist is either exposed or not. Greyscale values are only used for the positioning of the edge with sub-pixel accuracy. In 2.5D applications, each greyscale value is mapped to a specific thickness after development of the photo resist. Thus, the pattern for a 2.5D feature will contain much more grey scale values than patterns used for 2D lithography.

Gradients to Select Focal Plane(s)

For thick resist, one or more focal planes are selected to best reproduce the ideal feature in the thick resist layer. To select a single focal lane for the semi-sphere, for instance, a computer can be used to calculate gradients across the x and y grid, either from a pixelmap or for a pattern described by mathematical functions. The computer then calculates the normal vector either directly from the gradients or from a filtered version, either from a linear filtered version or a non-linear filtered version, of the gradients. Then for each z-height (the total thickness will be divided into several sub-sections), a distribution of the angles between the normal vector and XY-plane will be calculated.

By analyzing the distribution of the normal vector directions for these z-heights, the computer can select or assist a user in selecting focal planes at various z-heights that give a close match between the ideal features and the exposed result. An optimization search for a focal plane height can use linear or non-linear techniques. The penalty function used can be a function of the focus-height, z-height, the normal vector angle, or another measure.

FIG. 19 applies this algorithm to the semi-sphere pattern, depicting gradients and the gradient distribution. The data in the lower graph of FIG. 19 together with a distribution function for gradients at each z-height can be used to select the correct focal plane. A simple selection approach selects one focal plane. In the example above, the selection ignore average gradients below the so-called relaxation limit of 200. Depending on the geometry and desired sharpness of vertical corners, the relaxation limit may be higher or lower. In the top graph of FIG. 19, there is one pair so-called vertical corners, both at the same z-height, where the flat horizontal runs abruptly turn upward at the vertical edges of the semi-spheres. In the lower graph of FIG. 19, which plots the absolute value of average gradients against vertical position within the relief map or resist layer, the position of all vertical corners at the same height produces one peak in the graph. The focal plane is selected as depicted in FIG. 20. The relaxation limit, indicated by the horizontal dotted line, is used to isolate the part of the pattern in which the focal plane will be located. The position of the focal plane is selected based on a centre of gravity of the area above the relaxation limit. In FIG. 20, the area is a triangle and calculated focal plane height is around 0.27 μm.

The selection of a number of focal planes used to cover a single area above the relaxation limit will depend on the vertical extent being exposed, as a ratio of the depth of focus. The greater the available depth of focus, the greater the vertical extent of resist that can be effectively exposed by a focus in a single focal plane. In FIG. 20, the vertical extent of resist near the vertical corner and having a high average gradient is indicated by the base of the triangle. When this base is longer than some threshold factor of the depth of focus, multiple exposures will be needed. The factor may be one or two, which corresponds to our definition of a thin resist. When the depth of exposure exceeds the threshold, the vertical extent is partitioned into two or more vertical extents and focal planes are selected for the multiple vertical extents. Alternatively, if the number of focal planes allowed for exposing the resist layer is lower than the number of subsections, the focal planes are distributed in order to minimize the sum of the least squares norm (sometimes called the L2 norm) between each center of gravity and the closest focal planes.

FIG. 22 depicts a more complicated 2.5D relief, with a pillar and cap on top of an ellipse. Vertical corners are at about 0, 8 and 12 microns height. These corners are apparent in both the cross section in the top of FIG. 22 and the average gradient peaks in the bottom of the figure. Note the peak 2 and 3 is lower than the first one since the average absolute value of the gradient is calculated within a height interval and the sharp step only contains one sample point. The relaxation limit has adaptively been set at 50, to capture all three peaks. Preferably, three focal planes are selected. With three focal planes available, the algorithm will here place the planes at 0.27 µm, 8.25 µm and 12.25 µm. If a fewer focus layers are allowed, the algorithm may focus on the gradient peaks in the bottom graph of FIG. 22 that have highest Z-height components. For example if two focus layers were allowed it would have been 0.27 µm and 8.25 µm in the case above. Alternatively, if less than three are available, the sum of least squares between centers of gravity and focal planes can be calculated to position the focal planes. Or, where there are dominant peaks, as in FIG. 22, focal planes can be allocated to those peaks and the one of the least squares approaches described above can be applied to position the remaining peaks. This, of course, depends on having enough focal planes available to cover the dominant peaks and the remaining vertical segments that are outside the depth of focus of the focal planes selected to cover the dominant peaks.

Several variants of the algorithm are readily available. On could, for example, change the selection function to use maximum gradients in areas, instead of average gradients. Or, one could use a function that is based on higher moments than the gradient. The selection function can also vary. For example, based on calculating a mean instead of centre of gravity or matching focal planes to the gradient peaks.

With multiple focal planes, one should understand that doses are distributed among the focal planes, with doses emphasized in any plane(s) that contain a vertical corner. In FIG. 21, an x, y coordinate will have only one vertical corner at one height in one focal plane. In FIG. 22, some x, y coordinates have two vertical corners at different heights, so the dose will be distributed between the focal planes closest to the top and bottom of the pillar on top of the ellipse.

FIGS. 22-23 are photo micrographs of some features in resist that were formed using differently positioned focal planes. FIG. 22 had its focal plane selected by applying the approach described. FIG. 23, in contrast, was exposed with a less well chosen focus setting. FIG. 22 has sharper edges, as a result of the focal plane selection.

The method above can also be generalized by further allowing for several focus layers. These focus layers can be written in one pass by dynamically changing focus or using a writing engine that can write to several focal depths simultaneously, e.g. a multibeam writer with different focus for each beam or a SLM/DMD writer with a tilted focal plane over the chip. Alternatively, the data can be divided into several passes that are written separately with different focus settings.

If several focus settings are allowed, the basic optimization is the same as above except for that the optimization restraints are changed to allow multiple focus layers. The algorithm will then label each pixel to a certain focus layer.
Pattern Decomposition FIG. 24 illustrates how the algorithm may divide the pattern into two layers with different focus.

FIG. 25 illustrates the result assuming that the pattern is already defined. FIG. 26 shows a flow chart for the algorithm.

Some Particular Embodiments

The present invention may be practiced as a method or device adapted to practice the method. The invention may be an article of manufacture such as media impressed with logic to carry out computer-assisted formulation of an exposure map for three-dimensional patterning of resist.
Some Methods The first method embodiment forms a three-dimensional latent image with good depth and shape control in a resist layer 2673 applied over a workpiece 2683. This method is particularly well adapted to a thin resist layer 2673, such as resist layer that is thinner 2663 than the depth of focus of exposing system used the pattern to resist, which is defined above as twice a Rayleigh range 2676. It also may be applied to a moderately thin resist layer that is no more than twice as thick as the depth of focus of the exposing tool.

This method includes using a positive resist with an effective absorption characteristic that produces a log-linear relationship 2651 between the exposing energy and the depth of exposure. This log-linear relationship may otherwise be described as an exponential relationship, which is the inverse a log-linear relationship. The equations for a first-order approximation of the log-linear or exponential are given in the disclosure above. By first-order approximation, we mean that a more precise curve fit to calibration data can be achieved by adding additional terms or by taking into account processes in addition to the dominant absorbing process.

The method proceeds with converting a relief map that represents a three-dimensional surface 2611 into point-by-point exposure doses 2691 calculated to reach an exposure threshold of the positive resist at a plurality of controlled depths within the resist layer 2673. When the exposure doses are calculated, the calculation takes into account the log-linear relationship. An exposure map is produced. This exposure map may be prepared ahead of patterning and persisted for later use, or it may be as needed for patterning and consumed by a pattern generator close to the time that is prepared. Preparing the exposure map in advance may have the advantage of facilitating simulation and improvement.

This method optionally includes patterning the resist layer to form a three-dimensional latent image using a pattern generator 2615-2635 that varies effective exposure doses 2691 on a point-by-point basis using the exposure map.

This method can be extended by developing the latent image and producing a device using the developed latent image. The device may be produced directly or by replication. Examples of devices produced from 3-D patterning of resist are given in the disclosure above. One immediate example is a lenticular lens for three-dimensional viewing of an image. Alternatively, it may represent the relief map to a precision of at least 11 binary bits and use the 11-bit precision to produce exposure doses. Or, it may be calibrated to produce at least 1000 or 4000 dose steps between minimum and maximum exposure doses.

The positive resist used in the foregoing method may be a bleachable resist. By bleachable 2677, we mean including a component that absorbs photons, is converted by the photons, and is substantially a less absorptive after the conversion. This bleachable component may be essentially opaque prior to bleaching and transparent or translucent after bleaching. This component may make the resist layer opaque, before bleaching.

The effective absorbed a characteristic of the positive resist may result from passive absorption 2678. That is, the positive resist may include an effective quantity of a passive absorbing component that absorbs photons without chemically exposing the resist, for instance, converting the photons to heat. An effective amount of passive and absorbing components may be used to cause a log-linear relationship 2651 between exposure energy and depth of the exposure. Two examples of passive absorbing components are dye and nano-particles, such as soot.

When a log-linear relationship 2651 is present, the lower half of the resist (below 2675), further away from the surface that is exposed than the upper half of the resist (above 2675), requires more marginal energy to expose then the upper half. If the upper half uses one unit of energy, the lower half may use 2, 3, 4, 5 or more times as much energy as the upper half. Any of these proportions such as at least 3, may hold. When the lower half requires twice the "one unit" of exposing energy as the upper half, the total energy required to expose both halves will be three units. Of course, reference to units in this context is reference to arbitrary units. Alternatively, the lower quarter of the resist requires 100 times as much marginal exposure energy as the upper quarter.

The positive resist used in this method may have a gamma of five or greater (FIG. 2a). Alternatively, the resist may have a gamma of 8 or greater.

The pattern generator used may be a laser pattern generator 2615-2635.

A second method embodiment forms a three-dimensional latent image with good depth and shape control in a thick resist layer applied over a workpiece 2683. A thick resist layer may be 1.5 times as thick 2763 as the depth of focus of the pattern generator used to expose the resist, where the depth of focus is twice a Rayleigh range 2776. Alternatively, a thick resist layer may be twice as thick 2763 as the depth of focus. As illustrated in the figures, a thick resist alternatively may be at least three times as deep as the depth of focus.

This method proceeds using a thick positive resist that has a gamma of five or greater (FIG. 2a). Alternatively, the resist may have a gamma of 8 or greater. A gamma value corresponds to the steepness of exposure to dissolution rate curve, as illustrated in the figures. The higher the gamma, the narrower the dose band that moves the resist from having a very low dissolution rate to having a very high dissolution rate. A high gamma resist is also said to be a high contrast resist. It is suitable for endpoint or essentially endpoint processing. By essentially endpoint, we mean that the resist is dissolved until the rate of dissolution has dropped off very substantially, so that the development and dissolution process is relatively insensitive to the development time allowed. In contrast, the low gamma resist is often uses a carefully timed the etching process, giving a relief depth that is proportional to the etching time. A timed process, of course, is sensitive to etching time and other development-related factors.

The value of the theoretical gamma is a function of the type of resist chemistry, the resist concentration of the PAC, the baking time and temperature, and the developer. The dissolution is very slow up to a threshold value, and grows approximately linearly for high doses. The high contrast is achieved at the knee between very low dissolution rate and a dissolution rate which grows fast with the exposure dose. Therefore, the gamma value is high when development is slow and fast development means moving up on the linear part of the dissolution curve, giving low contrast and gamma. The gamma is therefore as much a property of the process, as of the resist material, and it is known that cold diluted developer produces very high gamma in some resist formulations. On the other hand, published dissolution curves in descriptions of laser- and ebeam processes for 3D (or 2.5D) surfaces often shows an approximately linear relation between remaining thickness and dissolution rate, i.e. a gamma around 1.

This second method proceeds with converting a relief map that represents a three-dimensional surface 2611 into point-by-point exposure doses calculated to exceed an exposure threshold of the positive resist at a plurality of controlled depths within the resist layer. The calculation optionally takes into account the numerical aperture 2656 of the exposing system. The numerical aperture value can be taken into account analytically or by empirical observation of in exposure of resist using different numerical apertures. The converted relief map results in exposure map will, as described above.

This method optionally proceeds with patterning the resist layer in multiple writing passes to form a three-dimensional latent image. The patterning uses a high dynamic range pattern generator 2615-2635 that varies exposure doses on a point-by-point basis using the exposure map 2691. By high dynamic range, mean a pattern generator calibrated produce at least 1000 steps between minimum and maximum exposure doses. It may use 11 binary bits or more precision. Alternatively, the pattern generator may be calibrated to produce at least 4,000 steps between minimum and maximum exposure doses.

The positive resist used in the foregoing method may be a bleachable resist. By bleachable 2677, we mean including a component that absorbs photons, is converted by the photons, and is substantially a less absorptive after the conversion. This bleachable component may be essentially opaque prior to bleaching and transparent or translucent after bleaching. This component may make the resist layer opaque, before bleaching.

The resist may have a passive absorption characteristic. That is, the positive resist may include an effective quantity of a passive absorbing component that absorbs photons 2678 without chemically exposing the resist, for instance, converting the photons to heat. An effective amount of passive and absorbing components may be used to cause a log-linear relationship between exposure energy and depth of the exposure 2651. Two examples of passive absorbing components are dye and nano-particles, such as soot.

The pattern generator 2615-2635 used may be a laser pattern generator.

Aspects of the first and second methods can be interchanged or recombined, as typically expressed in a dependent claim that depends from any of the forgoing claims. They also may be combined with features described in the foregoing disclosure.

A third method forms a three-dimensional latent image with good depth and shape control in a thick resist layer 2863 applied over a workpiece 2883. The meaning of thick resist in this method is as above. Of course, aspects of the first and second methods can be interchanged and recombined with aspects of the third method, as above.

The third method proceeds using a positive resist. It includes selecting multiple focal planes 1511, 1512, 1513 at which to focus exposing energy. At least one of focal planes 1513 is in a lower half of the resist layer. By lower half, we mean the half of the resist that is further from a surface to which exposing energy 2855 is applied than the upper half.

This method continues with converting a relief map that represents a three-dimensional surface into point-by-point and layer-by-layer and exposure doses 2691 calculated to exceed an exposure threshold of the positive resist at a plurality of controlled depths within the resist layer. The calculation takes into account the numerical aperture value 2656 to be used during patterning. Different numerical apertures may be applied to different focal planes. Applicable numerical apertures may be automatically selected. The method produces an exposure map 2691.

This method optionally proceeds with patterning the resist layer using the multiple focal planes to form a three-dimensional latent image, using a pattern generator 2615-2635 that varies effective exposure doses on a point-by-point basis using the exposure map 2691.

Another optional aspect of this method is selection of the focal plane 1513 in the lower half of the resist layer (below 2675) to emphasize accurate patterning of vertical or near-vertical aspects of features (e.g., 501, 1911) in the relief map. By vertical, we mean perpendicular to the surface of the workpiece 2883. Multiple focal planes can be automatically selected by identifying two or more vertical corners 2111, 2113, 2115 in features in the relief map that are at different vertical heights within the relief map and selecting two or more focal planes 1511, 1513, 1515 corresponding to the two or more corners and positioning them to enhance the three dimensional latent image of the vertical corners.

Alternatively, the focal plane in the lower half of the resist may be selected to emphasize accurate patterning of features in the relief map that have sharp z-direction details 1533. Or, the focal plane in the lower half may be selected to emphasize accurate patterning of features in the relief map that have relatively high spatial frequencies, as compared to other features in the relief map.

As in the second method, the pattern generator 2615-1635 used in the third matter used in the third method may have a high dynamic range. That is, it may be calibrated to produce at least 1000 dose steps between minimum and maximum exposure doses, to use at least 11 bits precision, or to produce at least 4000 dose steps.

Optionally, pixels of different sizes (FIG. 15) can be used in the multiple focal planes 1511, 1513, 1515.

Exposure in the different focal plans may be accomplished in a single writing pass by a pattern generator that supplies multiple beams 2855 that are focused in the different focal planes (FIG. 28). The pattern generator may expose the multiple focal planes in multiple writing passes 2832.

Exposure doses are allocated among layers 1511, 1513, 1515 and stored in the exposure map 2691 on a layer-by-layer basis. There are a variety of alternative ways of allocating exposure doses among the focal planes.

As described above, the allocation of doses among layers may involve applying linear interpolation, or 2D convolutions applied at depths selected from the relief map, or 3D convolutions simulating writing exposures in the multiple focal planes. The simulation may involve fully 3D convolutions, using volume pixel elements, also known as voxels.

This method may automatically select and/or position focal planes 1511, 1513, 1515. It may select one focal plane or two or more focal planes. It may automatically position any number of focal planes, whether selected automatically or by an operator.

The pattern generator 2615-2635 may be a laser pattern generator.

A fourth method forms of a three-dimensional latent image with good depth and shape control in a layer of resist 2673, 2773 applied over a workpiece 2683, 2783. It involves two or more iterations 2903 to improve an exposure map 2901. The method proceeds with converting a relief map that represents a three-dimensional surface 2611 into point-by-point exposure doses 2901. The point-by-point exposure doses are calculated to exceed an exposure threshold of the resist at a plurality of controlled depths within the resist layer, producing an exposure map.

The method proceeds with two or more iterations 2903 of simulating on a computer 2902 the patterning of the resist layer with a pattern generator that varies effective exposure doses on a point-by-point basis using the exposure map. This simulating produces a simulated three-dimensional latent image 2925, 2926. The simulated three-dimensional latent image 2925, 2926 is compared 2924 to the relief map 2611. The exposure map is revised using results of the comparing.

This method may iterate 2903 five or ten times or more.

A further aspect of this method involves calculating a sweep adjustment during the converting of the relief map. A sweep adjustment takes into account a direction of travel of exposing radiation across the resist layer and compensates for non-linear effects related to whether the exposure is building or diminishing (FIG. 5) as the exposing radiation moves across the resist layer. The calculated sweep adjustment may be incorporated into the exposure map.

This method also may include the simulating step taking into account the direction of travel of exposing radiation (FIG. 5) across the resist layer and non-linear effects related to whether exposure is building or diminishing as the exposing radiation moves across resist layer.

The resist used in the foregoing method may be a positive, bleachable 2677 resist. By bleachable, we mean including a component that absorbs photons, is converted by the photons, and is substantially a less absorptive after the conversion. This bleachable component may be essentially opaque prior to bleaching and transparent or translucent after bleaching. This component may make the resist layer opaque, before bleaching.

The resist may have a passive absorption characteristic. That is, the positive resist may include an effective quantity of a passive absorbing component 2678 that absorbs photons without chemically exposing the resist, for instance, converting the photons to heat. An effective amount of passive and absorbing components may be used to cause a log-linear relationship 2651 between exposure energy and depth of the exposure. Two examples of passive absorbing components are dye and nano-particles, such as soot.

This iterative method may be applied to refine any of the foregoing methods of forming a three-dimensional latent image. In a thick layer of resist, this method may be extended by defining multiple focal planes 1511, 1513, 1515 at which to focus exposing energy. The relief map may be converted into point-by-point and layer-by-layer exposure doses, producing the exposure map 2691, 2901. The simulation, in turn, proceeds taking into account the multiple focal planes.

The meaning of a thick layer in this extension of the fourth method is as described above. The positive resist the simulated may have a gamma of five or greater or, alternatively, eight or greater. This simulating may take into account the numerical aperture 2656 of the pattern generator 2615-2635 when writing to the multiple focal planes. The simulated pattern generator and maybe a high dynamic range pattern generator that is calibrated to produce a least 1000 dose steps between minimum and maximum exposure doses, or that is calibrated to produce at least 4000 dose steps.

The iteration may be continued beyond one refinement, repeating the simulating, comparing and revising actions until results of comparing the difference 2924 between successive simulated three-dimensional latent images 2925, 2926 satisfies a predetermined criterion.

In a thick resist layer, the method may further include defining multiple focal planes 1511, 1513, 1515 at which to focus exposing energy 2655, 2855, converting the relief map into point-by-point and layer-by-layer exposure doses 2691, the exposure doses allocated by layer, producing the exposure map 2901, and simulating the patterning of the resist layer 2925, 2926 using the multiple focal planes.

Focal plane positions and/or counts may be automatically selected based on data in the relief map, such as data that describes vertical corners.

A thick layer may be as described above, 1.5 or two or three or more times the depth of focus of a pattern generator.

The resist may have a gamma of 5 or 8 or greater.

The simulating may take into account a numerical aperture 2656 of the pattern generator 2615-2635, which may change from one focal plane to the next or one writing pass to the next.

The simulated pattern generator may be configured to produce at least 1000 dose steps, or to use at least 11 binary bits precision or to produce at least 4000 dose steps.

This method optionally includes using a pattern generator, such as a laser pattern generator, to apply the refined exposure map to patterning a thin or thick layer of resist applied to the surface of a workpiece. As previously mentioned, the method may be extended by developing the resist and producing devices using the developed resist.

The pattern generator may be a laser pattern generator.

Devices that Practice the Methods

Each of the methods described above involve close cooperation among specialized hardware components. Maps are stored in memory. Map processors are used to convert maps and apply transfer functions. Simulation processors are used to conduct simulations. Lasers, lenses and resist are used to form latent images on workpieces. The lasers and resists have a variety of alternative characteristics, as described above. Depending on the application, the map and simulation processors may determine point-by-point exposures for different thicknesses and characters of resist.

Articles of Manufacture

While the present invention is disclosed by reference to the preferred embodiments and examples detailed above, it is understood that these examples are intended in an illustrative rather than in a limiting sense. Computer-assisted processing is implicated in the described embodiments. Accordingly, the technology disclosed may be embodied in methods for calculating exposure doses and writing passes to create 2.5D latent images in resist with a high gamma. It may be embodied in systems including logic and hardware resources to calculate exposure doses and writing passes, systems that take advantage of computer-assisted calculation of exposure doses and writing passes, computer readable storage media impressed with logic to carry out calculation of exposure doses and writing passes, data streams impressed with logic to carry out calculation of exposure doses and writing passes, or computer-accessible services that carry out computer-assisted calculation of explore doses and writing passes. It is contemplated that modifications and combinations will readily occur to those skilled in the art, which modifications and combinations will be within the spirit of the invention and the scope of the following claims.

The methods, devices and articles of manufacture can be combined with or applied using a writing system as described, thereby creating a 2.5D latent image in the resist layer. The 2.5D latent image can be developed to produce a 2.5D structure. The 2.5D structure might be used directly or may be used as masters for replication and production of micro-structures, as generally described above. The resulting structures may be optical, mechanical, fluidic or similar component or devices.

We claim as follows:

1. A method of forming a three-dimensional latent image with good depth and shape control in a thick resist layer applied over a workpiece surface, the method including:
    using in the thick resist layer a positive resist;
    selecting multiple focal planes at which to focus exposing energy, wherein at least one of the focal planes is in a lower half of the thick resist layer, the lower half being the half that is further from a surface to which exposing energy is applied;
    converting a relief map that represents a three-dimensional surface into point-by-point and layer-by-layer exposure doses calculated to exceed an exposure threshold of the positive resist at a plurality of controlled depths within the resist layer, taking into account a numerical aperture value to be used during patterning, producing an exposure map; and
    patterning the resist layer using the multiple focal planes to form a three-dimensional latent image using a pattern generator that varies effective exposure doses on a point-by-point basis using the exposure map.

2. The method of claim 1, wherein the selecting the focal plane in the lower half emphasizes accurate patterning of vertical or near vertical parts of features in the relief map.

3. The method of claim 1, wherein the selecting multiple focal planes further includes:
    identifying two or more vertical corners in features in the relief map that are at different vertical heights within the relief map;
    selecting two or more focal planes corresponding to the two or more corners and positioning them to enhance the three-dimensional latent image of the vertical corners.

4. The method of claims 1, wherein the selecting the focal plane in the lower half emphasizes accurate patterning of features in the relief map that have relatively high spatial frequencies, as compared to other features in the relief map.

5. The method of claim 1, wherein the pattern generator is a high dynamic range pattern generator that is calibrated to produce at least 1000 dose steps between minimum and maximum exposure doses.

6. The method of claim 1, further including using pixels of different sizes in the multiple focal planes.

7. The method of claim 1, wherein the pattern generator supplies, in a single writing pass, multiple beams focused in the different focal planes.

8. The method of claim 1, further including focusing the pattern generator in the multiple writing planes in multiple writing passes.

9. The method of claim 1, wherein the converting further includes allocating exposure doses among layers and storing the allocated exposure doses layer-by-layer in the exposure map.

10. The method of claim 1, further including applying linear interpolation wherein each layer is treated as having been exposed with an average focus.

11. The method of claim 1, further including representing exposure at each of the focal planes as a plurality of 2D convolutions at depths selected from the relief map and applying the 2D convolutions in the simulating.

12. The method of claim 1, further including convolution by discrete simulation of writing to the multiple focal planes.

13. The method of claim 1, further including representing portions of the layer of resist as volume pixels, so-called voxels.

14. The method of claim 3, further including automatically selecting a number of focal planes based on detection of vertical corners in the relief map.

15. The method of claim 1, further including automatically selecting positions of one or more focal planes based on data in the relief map.

16. The method of claim 3, further including automatically selecting positions of two or more focal planes based on data in the relief map.

17. The method of claim 1, wherein the pattern generator is a laser pattern generator.

* * * * *